(12) United States Patent
Hwu et al.

(10) Patent No.: US 11,195,835 B2
(45) Date of Patent: Dec. 7, 2021

(54) MEMORY DEVICE AND MANUFACTURING METHOD THEREOF

(71) Applicants: TAIWAN SEMICONDUCTOR MANUFACTURING CO., LTD., Hsinchu (TW); NATIONAL TAIWAN UNIVERSITY, Taipei (TW)

(72) Inventors: Jenn-Gwo Hwu, Taipei (TW); Bo-Jyun Chen, Taoyuan (TW); Kuan-Wun Lin, Changhua County (TW)

(73) Assignees: TAIWAN SEMICONDUCTOR MANUFACTURING CO., LTD., Hsinchu (TW); NATIONAL TAIWAN UNIVERSITY, Taipei (TW)

( * ) Notice: Subject to any disclaimer, the term of this patent is extended or adjusted under 35 U.S.C. 154(b) by 0 days.

(21) Appl. No.: 16/727,686

(22) Filed: Dec. 26, 2019

(65) Prior Publication Data

US 2021/0202484 A1   Jul. 1, 2021

(51) Int. Cl.
*H01L 27/105* (2006.01)

(52) U.S. Cl.
CPC .............. *H01L 27/1052* (2013.01)

(58) Field of Classification Search
CPC ........... H01L 27/1052; H01L 29/42344; H01L 27/11568; H01L 27/11565; H01L 29/40117

See application file for complete search history.

(56) References Cited

U.S. PATENT DOCUMENTS

2018/0138317 A1* 5/2018 Lin ................... H01L 29/6656
2018/0166451 A1* 6/2018 Yang .................. H01L 27/1157

OTHER PUBLICATIONS

C. Liao et. al., "Energy-Saving Write/Read Operation of Memory Cell by Using Separated Storage Device and Remote Reading With an MIS Tunnel Diode Sensor", IEEE Journal of the Electron Devices Society, vol. 4, No. 6, pp. 424-429, Nov. 2016.
A.Prakash et al., "Resistance controllability and variability improvement in a TaOx-based resistive memory for multilevel storage application", Appl. Phys. Lett. 106, 233104 (2015).
Park, Jubong et al., "Multibit Operation of TiOx-Based ReRAM by Schottky Barrier Height Engineering", IEEE Electron Device Letters, vol. 32, No. 4, pp. 476-478, Apr. 2011.

* cited by examiner

*Primary Examiner* — Mohammed R Alam
(74) *Attorney, Agent, or Firm* — Maschoff Brennan

(57) ABSTRACT

A memory device includes a memory cell, a writing transistor, and a reading transistor. The memory cell includes a semiconductor substrate, a tunneling layer, a storage layer, a first electrode, a second electrode, and a third electrode. The tunneling layer is over the semiconductor substrate. The storage layer is on the tunneling layer. The first electrode is on the storage layer. The second electrode is on the tunneling layer. The storage layer has a sidewall facing the second electrode. The third electrode is spaced apart from the second electrode. The writing transistor is electrically connected to the first electrode of the memory cell. The reading transistor is electrically connected to the second electrode of the memory cell.

20 Claims, 36 Drawing Sheets

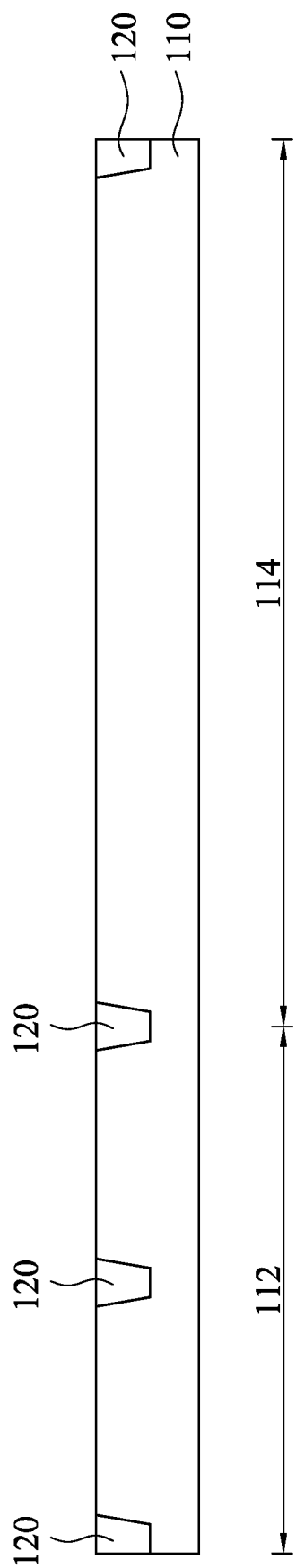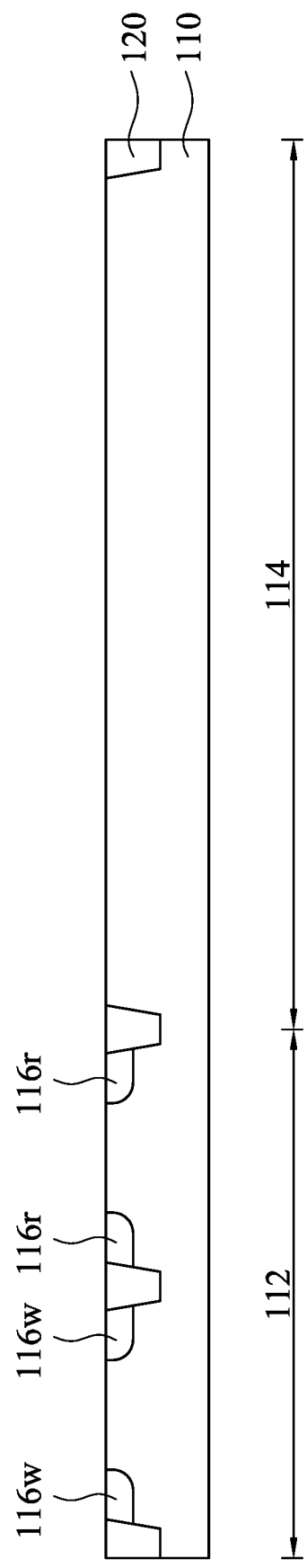

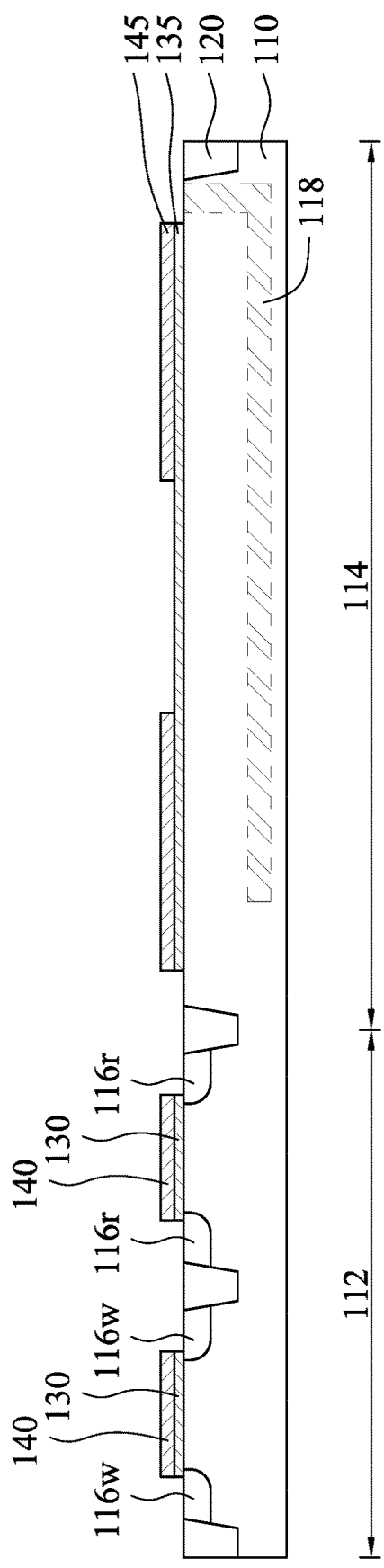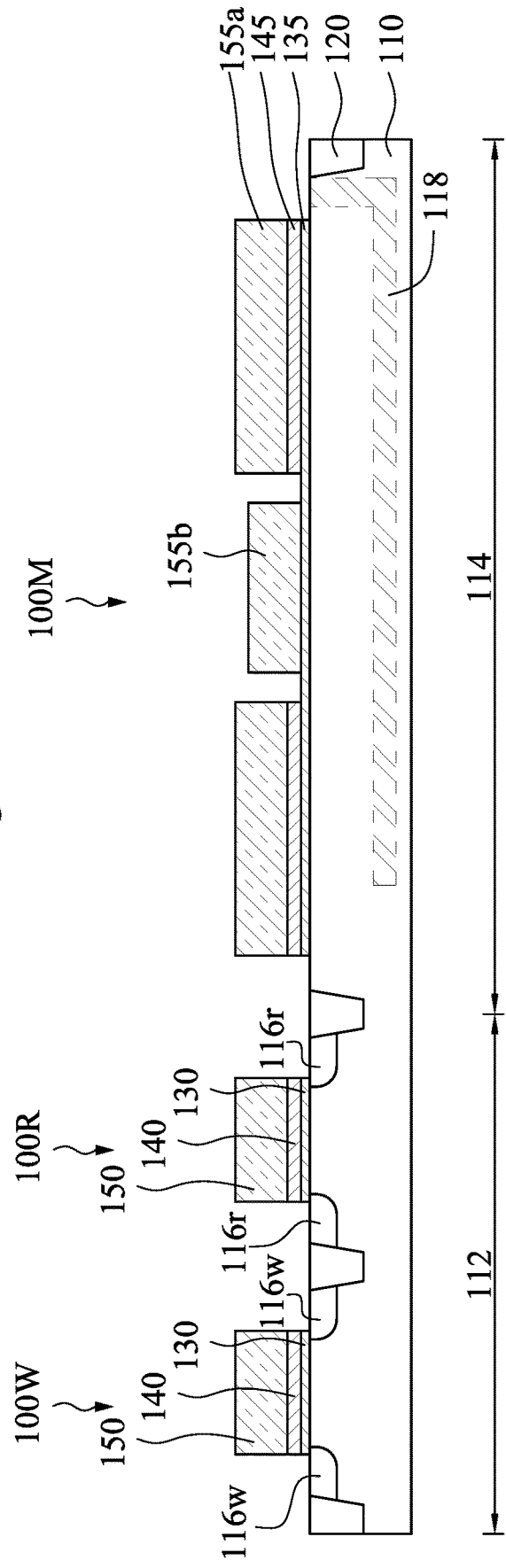

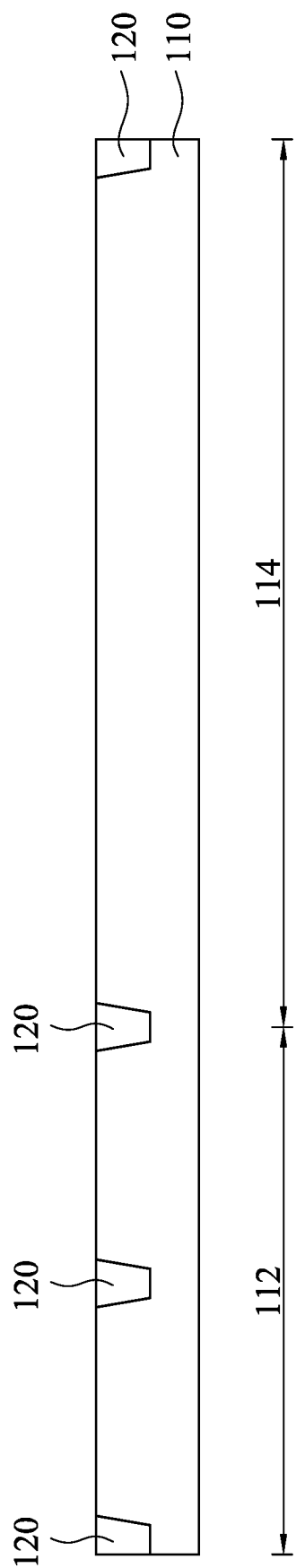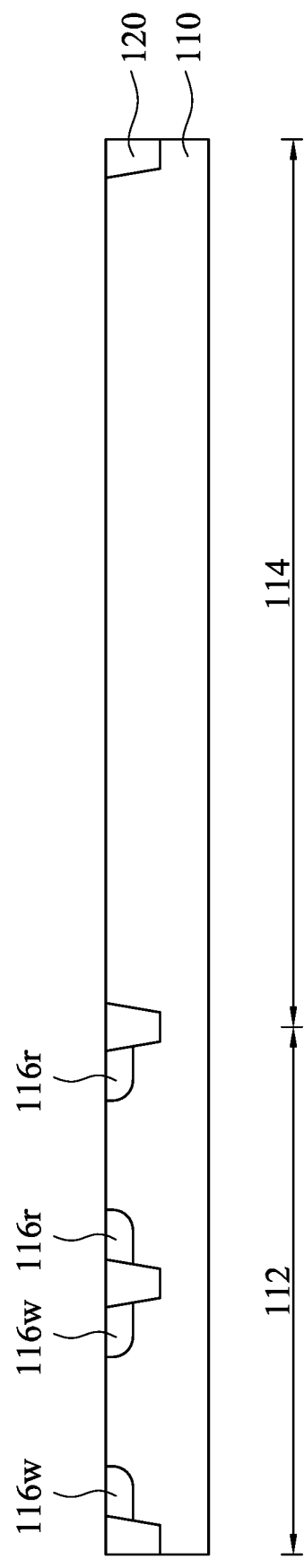

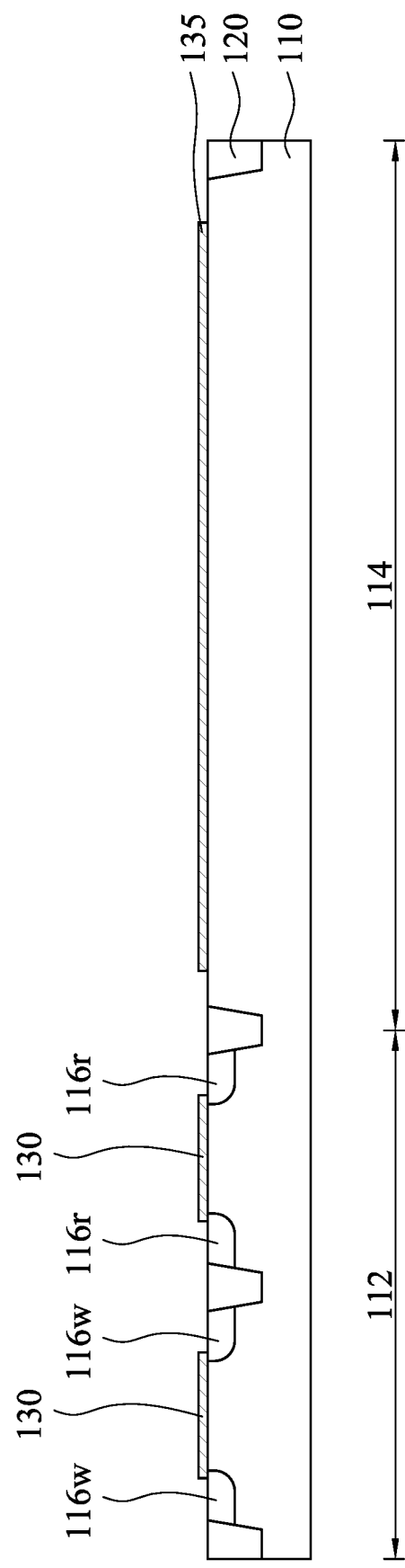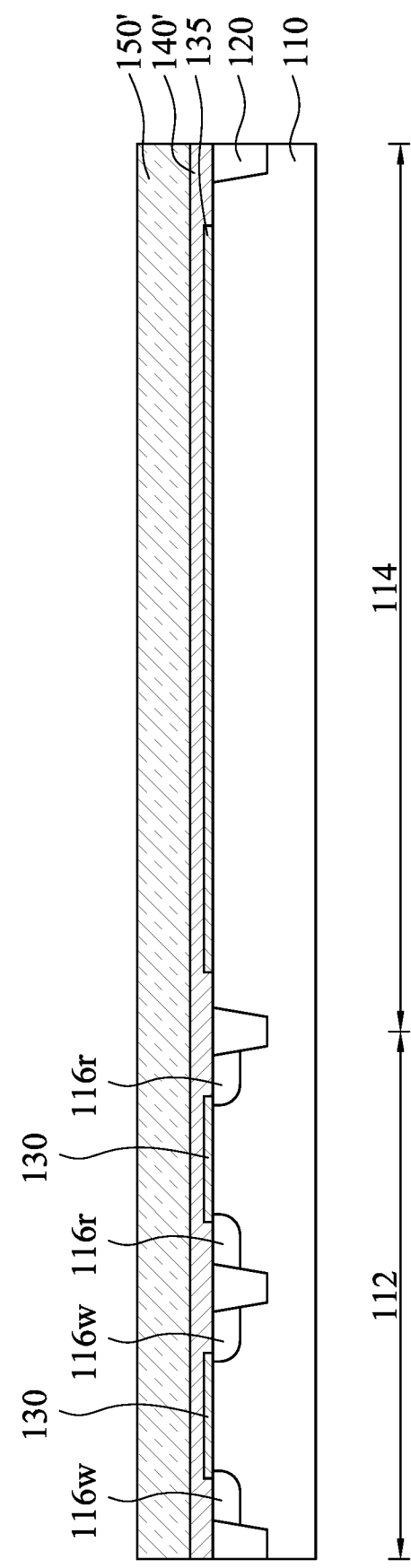

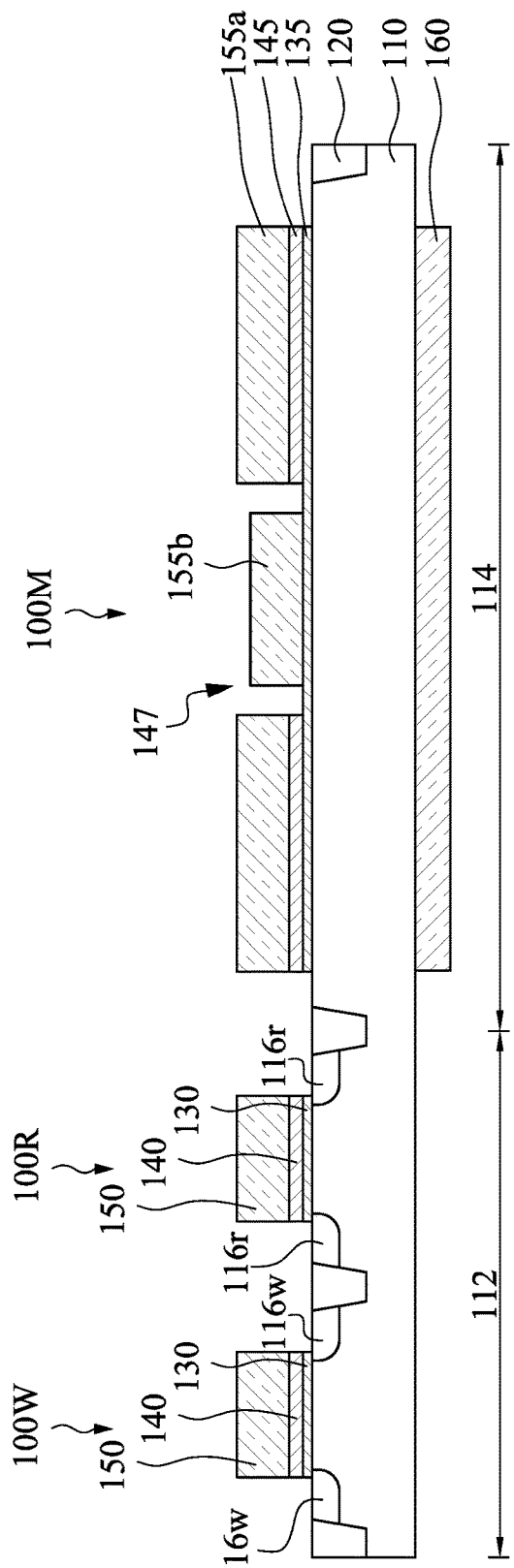
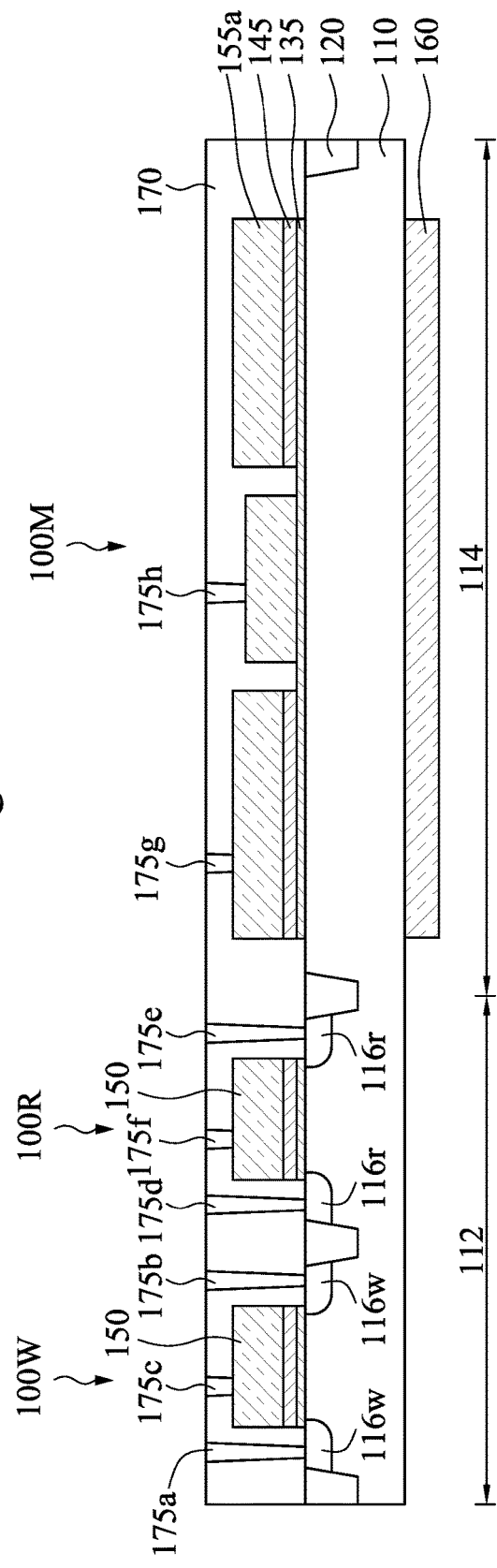

M50

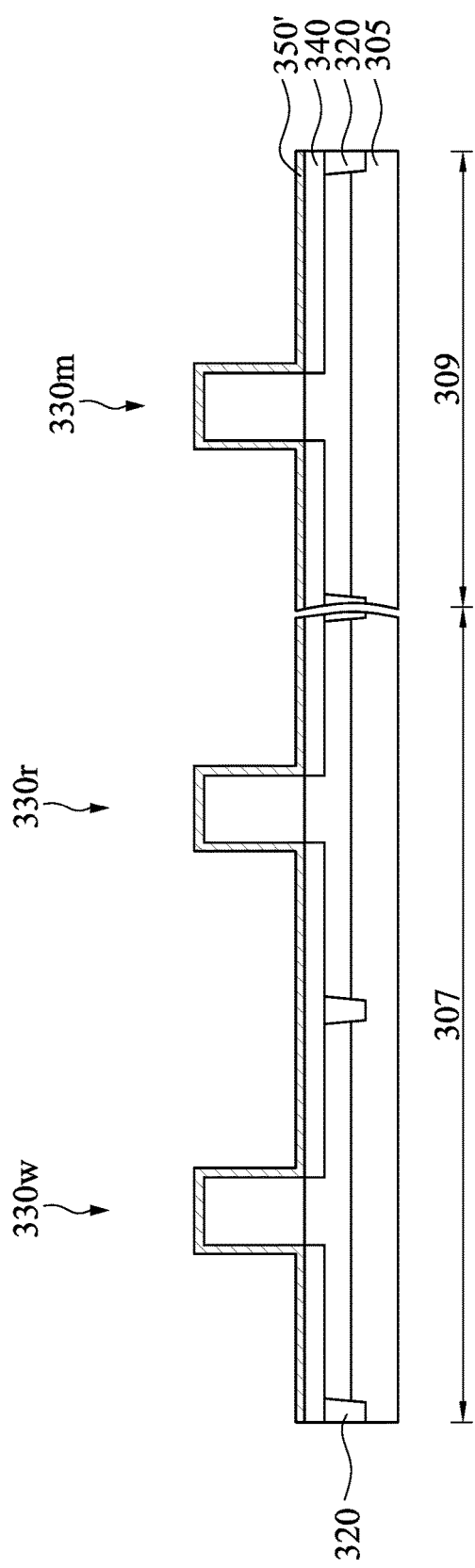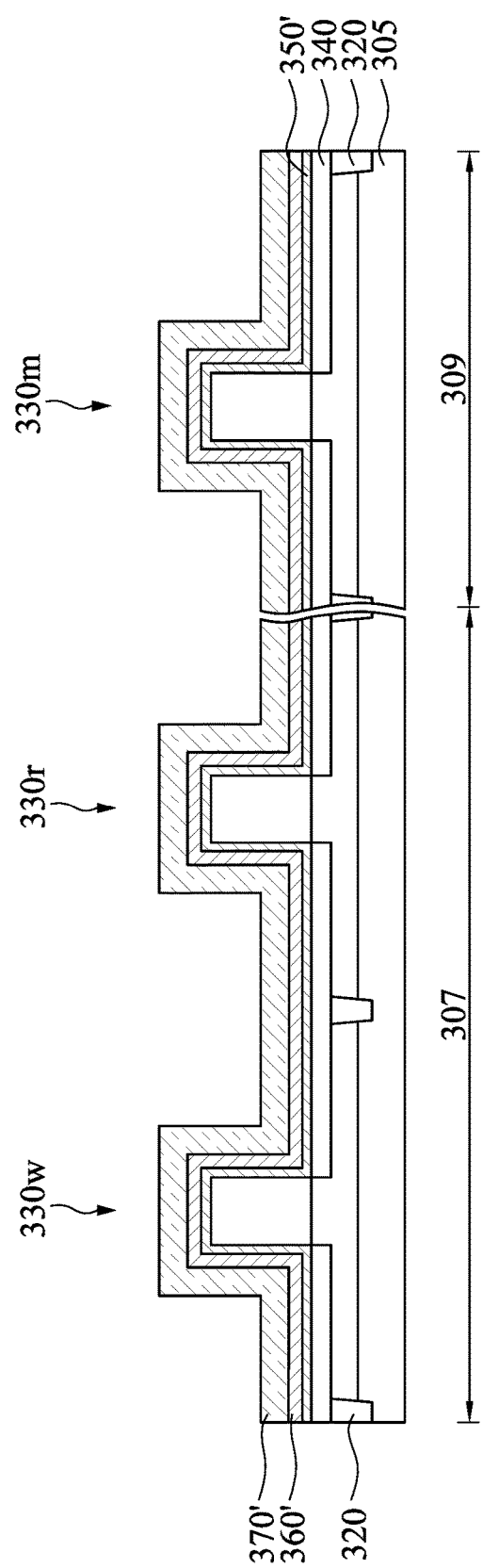

US 11,195,835 B2

MEMORY DEVICE AND MANUFACTURING METHOD THEREOF

BACKGROUND

Memory devices are used to store information in semiconductor devices and systems. The popular dynamic random access memory (DRAM) cell includes a switch and a capacitor. DRAMs are highly integrated and fast memory devices, but they do not retain data when power is cut off.

On the other hand, a nonvolatile memory device is capable of retaining data even after power is cut off. Examples of nonvolatile memory devices include the flash memory, magnetic random access memories (MRAMs), resistive random access memories (RRAMs) and phase-change random access memories (PCRAMs). MRAMs store data using variations in the magnetization direction at tunnel junctions. PCRAMs store data using resistance variations caused by phase changes of specific materials. RRAMs store data by changes in electric resistance, not by changes in charge capacity.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A to 2G respectively illustrate cross-sectional views of the memory device at various stages in accordance with some embodiments of the present disclosure.

FIGS. 7A to 7H respectively illustrate cross-sectional views of the memory device at various stages in accordance with some embodiments of the present disclosure.

FIGS. 9A to 9I respectively illustrate cross-sectional views of the memory device at various stages in accordance with some embodiments of the present disclosure.

FIGS. 11A to 11M respectively illustrate cross-sectional views of the memory device at various stages in accordance with some embodiments of the present disclosure.

DETAILED DESCRIPTION

Figure 1A:
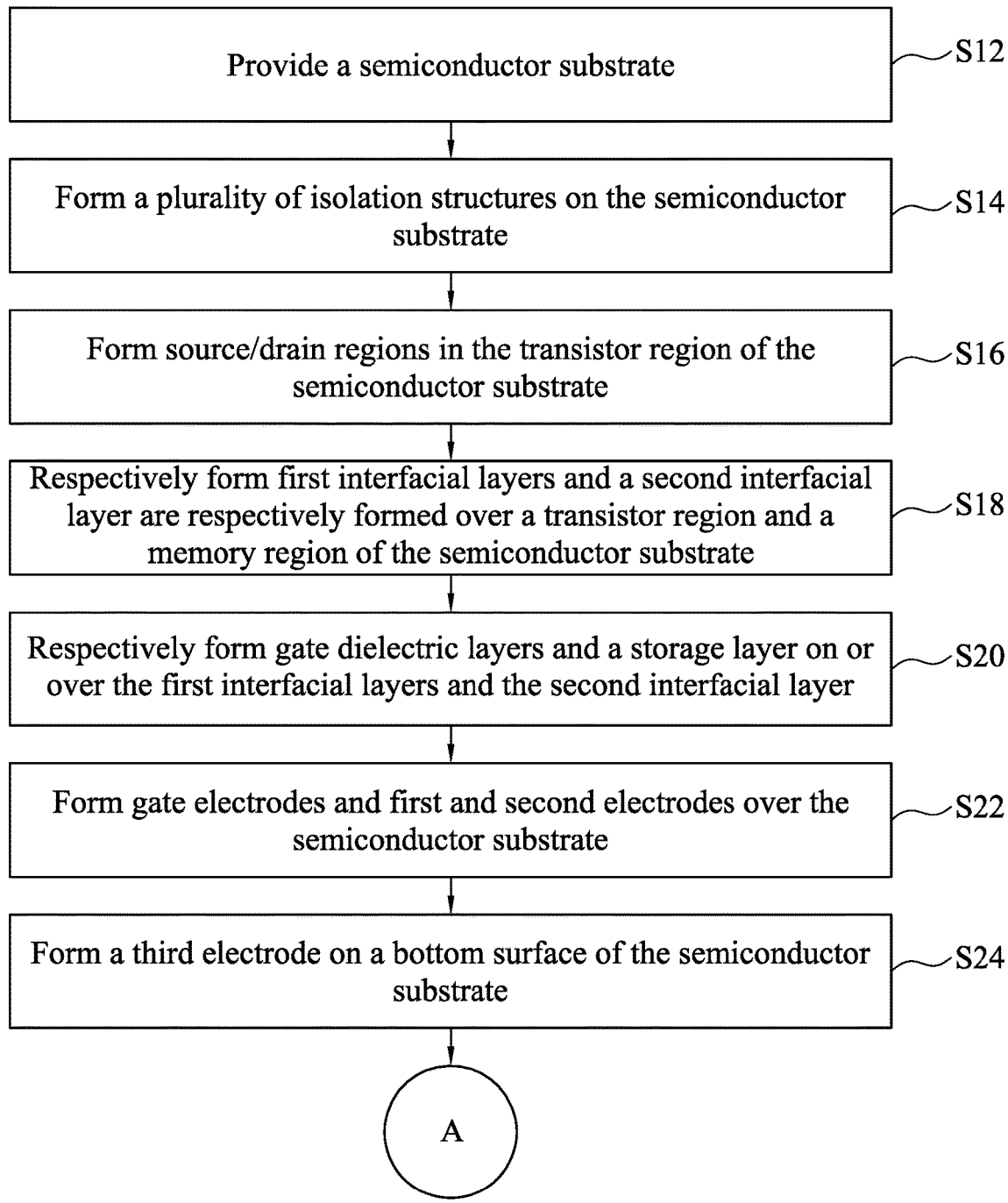
FIGS. 1A and 1B are a flowchart of a method for making a memory device according to aspects of the present disclosure in various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around", "about", "approximately", or "substantially" shall generally mean within 20 percent, or within 10 percent, or within 5 percent of a given value or range. Numerical quantities given herein are approximate, meaning that the term "around", "about", "approximately", or "substantially" can be inferred if not expressly stated.

This disclosure relates to integrated memory fabrications and more specifically to two-transistor-one-memory-cell formations by forming the memory cell with a patterned storage layer. The memory cell stores different (more than two) distinct states when different voltages are applied. Such structure and its method provide a new type memory device and do not add area burden to the device.

Figure 1B:
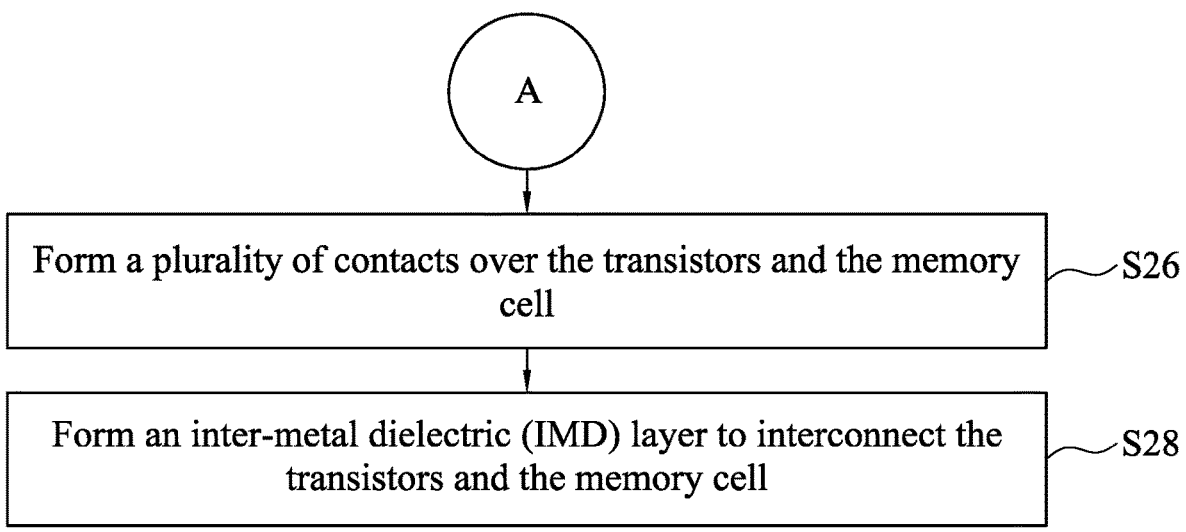
Figure 2C:
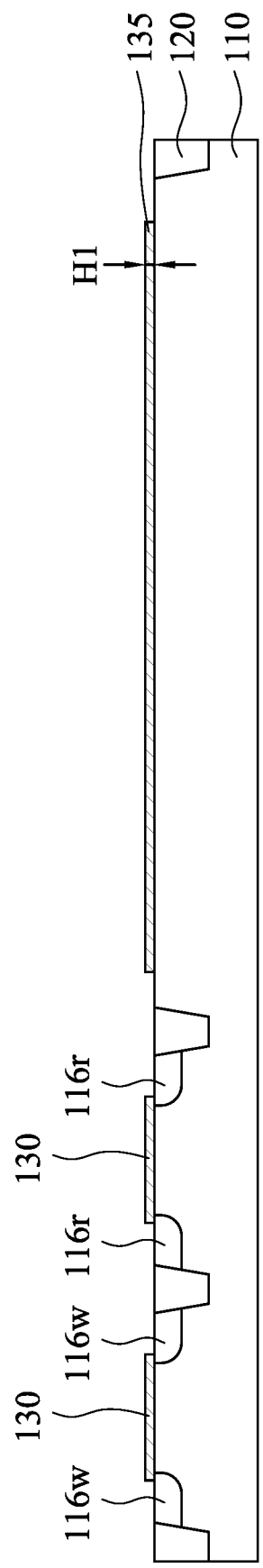

FIGS. 1A and 1B are a flowchart of a method M10A for making a memory device according to aspects of the present disclosure in various embodiments. Various operations of the method M10A are discussed in association with cross-section diagrams FIGS. 2A-2G. Throughout the various views and illustrative embodiments, like reference numbers are used to designate like elements. In operation S12 of method M10A, a semiconductor substrate 110 is provided, as shown in FIG. 2A. The semiconductor substrate 110 has a transistor region 112 and a memory region 114. In some embodiments, the semiconductor substrate 110 may be a semiconductor material and thus may be referred to as a semiconductor layer. The semiconductor substrate 110 may include a graded layer or a buried oxide, for example. In some embodiments, the semiconductor substrate 110 includes bulk silicon that may be undoped or doped (e.g., p-type, n-type, or a combination thereof). Other materials that are suitable for semiconductor device formation may be used. Other materials, such as germanium or GaAs could alternatively be used for the semiconductor substrate 110. Alternatively, the silicon substrate 110 may be a multi-layered structure such as a silicon-germanium layer formed on a bulk silicon layer.

In operation S14 of method M10A, a plurality of isolation structures 120 are formed on the semiconductor substrate 110, as shown in FIG. 2A. The isolation structures 120 may be formed by chemical vapor deposition (CVD) techniques using tetra-ethyl-ortho-silicate (TEOS) and oxygen as a precursor. In some other embodiments, the isolation structures 120 may be formed by implanting ions, such as oxygen, nitrogen, carbon, or the like, into the semiconductor substrate 110. In yet some other embodiments, the isolation structures 120 are insulator layers of a SOI wafer. The isolation structures 120, which act as shallow trench isolations (STIs), are formed between the transistor region 112 and the memory region 114.

In operation S16 of method M10A, source/drain regions 116w and 116r are formed in the transistor region 112 of the semiconductor substrate 110, as shown in FIG. 2B. A mask layer (may be a hard mask layer) may be formed over the top surface of the semiconductor substrate 110, and a plurality of openings are formed in the mask layer. An implantation process is then performed to introduce impurities into the semiconductor substrate 110 to form source/drain regions 116w and 116r, and the patterned mask layer may act as a mask to substantially prevent the impurities from being implanted into other regions of the semiconductor substrate 110. The impurities may be n-type impurities or p-type impurities. The n-type impurities may be phosphorus, arsenic, or the like, and the p-type impurities may be boron, $BF_3$, or the like. Then, the photoresist and the patterned mask layer are removed.

In operation S18 of method M10A, first interfacial layers 130 and a second interfacial layer 135 are respectively formed over the transistor region 112 and the memory region 114 of the semiconductor substrate 110, as shown in FIG. 2C. Specifically, a blanket dielectric layer may be formed over the semiconductor substrate 110, and a patterning process is performed on the blanket dielectric layer to form the first interfacial layers 130 and the second interfacial layer 135. The first interfacial layers 130 and the second interfacial layer 135 may include materials such as tetraethylorthosilicate (TEOS)-formed oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. In some other embodiments, the first interfacial layers 130 and the second interfacial layer 135 may be a high-κ dielectric layer having a dielectric constant (κ) higher than the dielectric constant of $SiO_2$, i.e. κ>3.9. The first interfacial layers 130 and the second interfacial layer 135 may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or other suitable materials. The blanket dielectric layer may be deposited by a CVD process, ALD process, or other suitable deposition technique.

In FIG. 2C, the first interfacial layers 130 are formed over the semiconductor substrate 110 and respectively between the source/drain regions 116w and 116r. The first interfacial layers 130 are configured to be gate interfacial layers. In some embodiments, the second interfacial layer 135 is spaced apart from the isolation structure 120 and is configured to be a tunneling layer of the following formed memory cell 100M (see FIG. 2E). In some embodiments, each of the first interfacial layers 130 and the second interfacial layer 135 has a height H1 in a range of about 1.5 nm to about 5 nm. For the second interfacial layer 135, if the height H1 is greater than about 5 nm, carriers may not tunnel through the second interfacial layer 135; if the height H1 is less than about 1.5 nm, the carriers may directly pass through the second interfacial layer 135 without tunneling.

Figure 2D:
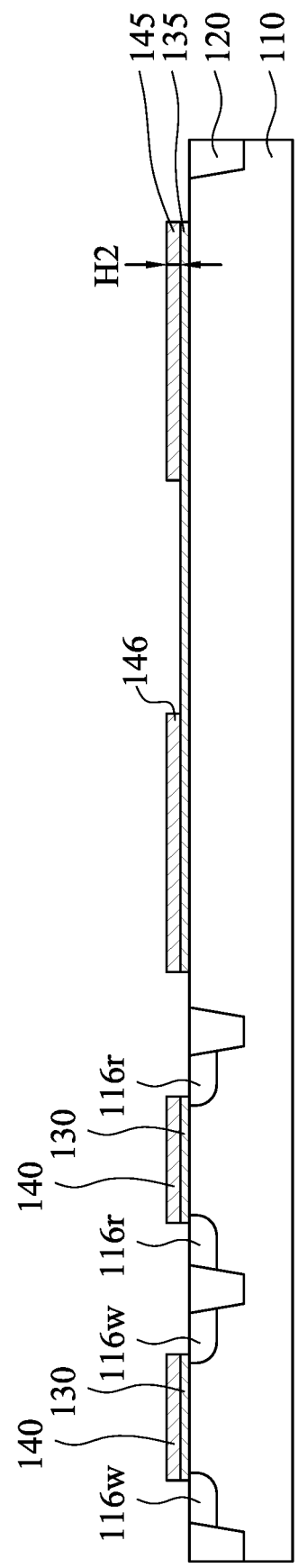

In operation S20 of method M10A, gate dielectric layers 140 and a storage layer 145 are respectively formed on or over the first interfacial layers 130 and the second interfacial layer 135, as shown in FIG. 2D. Specifically, another blanket dielectric layer may be formed over the semiconductor substrate 110, and a patterning process is performed on the blanket dielectric layer to form the gate dielectric layers 140 and the storage layer 145. The gate dielectric layers 140 and the storage layer 145 may be a high-κ dielectric layer having a dielectric constant (κ) higher than the dielectric constant of $SiO_2$, i.e. κ>3.9. In some embodiments, the dielectric constant of the storage layer 145 is greater than or equal to the dielectric constant of the second interfacial layer 135. The gate dielectric layers 140 and the storage layer 145 may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or other suitable materials. The blanket dielectric layer is deposited by suitable techniques, such as ALD, CVD, PVD, thermal oxidation, combinations thereof, or other suitable techniques, and the blanket dielectric layer is patterned by an etching process, such as a dry etching, a wet etching, or combinations thereof.

In FIG. 2D, the gate dielectric layers 140 are respectively on and in contact with the first interfacial layers 130. The gate dielectric layer 140 and the first interfacial layer 130 may be substantially coterminous or non-coterminous. The storage layer 145 is on and in contact with the second interfacial layer 135. The etching process of the storage layer 145 induces additional traps at the sidewall 146 thereof mainly due to the broken bonds at the sidewall 146 of the storage layer 145. The additional traps (broken bonds) are capable to store more electrons, and these additional electrons provide additional states for the memory cell. The structural details of the storage layer 145 will be described in FIGS. 2E and 3-4F. In some embodiments, each of the gate dielectric layers 140 and the storage layer 145 has a height H2 in a range of about 15 nm to about 40 nm. For the storage layer 145, if the height H2 is greater than about 40 nm, the retention of the memory device may be reduced; if the height H2 is less than about 15 nm, the amounts of carriers (electrons) stored on the sidewalls of the storage layer 145 may not enough to provide multiple states.

Figure 2E:
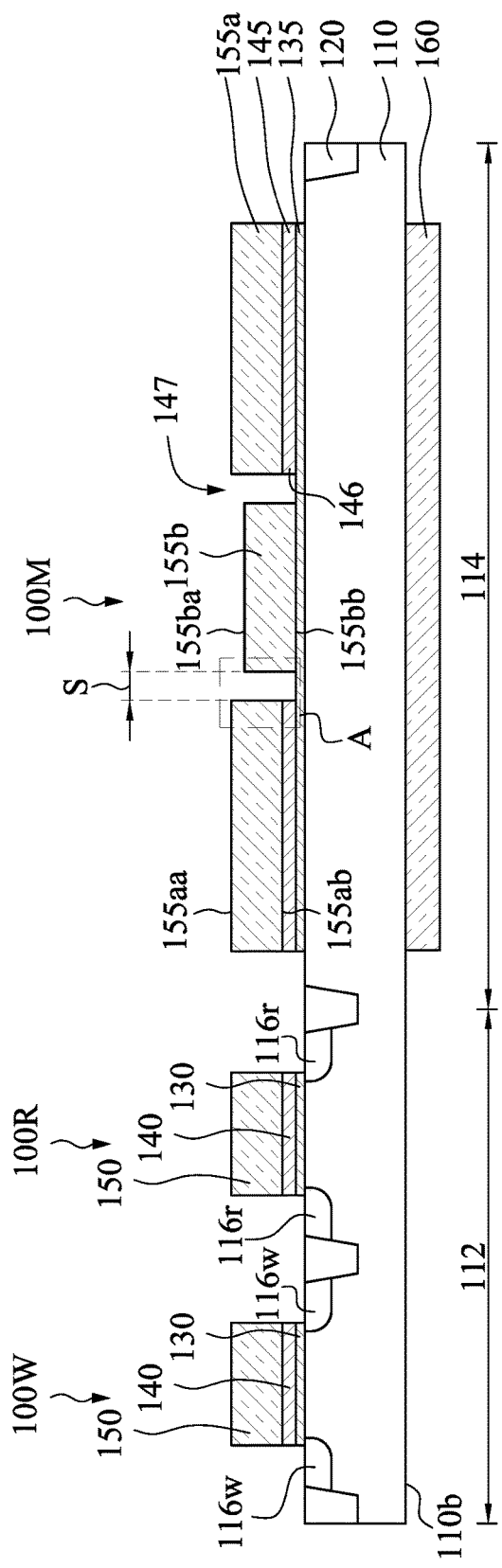

In operation S22 of method M10A, gate electrodes 150a and first and second electrodes 155a, 155b are formed over the semiconductor substrate 110, as shown in FIG. 2E. Specifically, a blanket conductive layer may be formed over the semiconductor substrate 110, and a patterning process is performed on the blanket conductive layer to form the gate electrodes 150a and the first and second electrodes 155a, 155b. The gate electrodes 150a and the first and second electrodes 155a, 155b are made of conductive materials such as polysilicon or metal e.g., W, Ti, TiAlC, Al, TiAl, TaN, TaAlC, TiN, TiC, Co, TaC, Al, TiAl, HfTi, TiSi, TaSi, TiAlC, combinations thereof, or the like. The blanket conductive layer may be formed by chemical vapor deposition (CVD), physical vapor deposition (PVD) including sputtering, atomic layer deposition (ALD) or other suitable method, and the blanket conductive layer is patterned by an etching process, such as a dry etching, a wet etching, or combinations thereof.

In operation S24 of method M10A, a third electrode 160 is formed on a bottom surface 110b of the semiconductor substrate 110, as shown in FIG. 2E. Specifically, another blanket conductive layer may be formed on the bottom surface 110b of the semiconductor substrate 110, and a patterning process is performed on the blanket conductive layer to form the third electrode 160. The substrate 110 is between the second interfacial layer 135 and the third electrode 160. The third electrode 160 may be made of conductive materials such as metal e.g., W, Ti, TiAlC, Al, TiAl, TaN, TaAlC, TiN, TiC, Co, TaC, Al, TiAl, HfTi, TiSi, TaSi, TiAlC, combinations thereof, or the like. The blanket conductive layer may be formed by chemical vapor deposition (CVD), physical vapor deposition (PVD) including sputtering, atomic layer deposition (ALD) or other suitable method, and the blanket conductive layer is patterned by an etching process, such as a dry etching, a wet etching, or combinations thereof.

Figure 3:
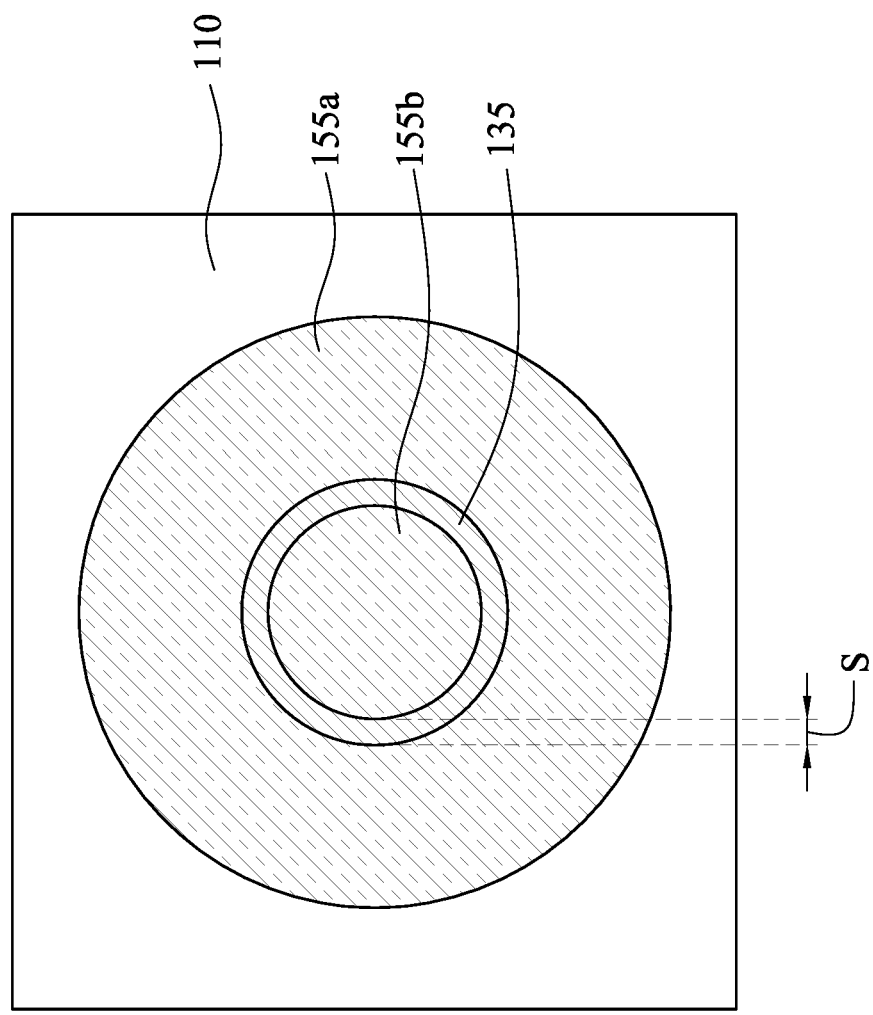
FIG. 3 is a top view of the memory cell in FIG. 2E.

FIG. 3 is a top view of the memory cell 100M in FIG. 2E. Reference is made to FIGS. 2E and 3. The memory cell 100M of the memory device includes a first electrode 155a, a second electrode 155b, a third electrode 160, a storage layer 145, and a tunneling layer (i.e., the second interfacial layer) 135. The first electrode 155a and the storage layer 145 are formed over the tunneling layer 135. In some embodiments, the first electrode 155a and the storage layer 145 are ring-shaped, such that an accommodating area 147 is defined by the storage layer 145. The second electrode 155b is in the accommodating area 147, i.e., the storage layer 145 surrounds the second electrode 155b. Further, the second electrode 155b is in contact with the tunneling layer 135. The second electrode 155b is at a level lower than the first electrode 155a, such that a bottom surface 155ab of the first electrode 155a is higher than a bottom surface 155bb of the second electrode 155b, and a top surface 155aa of the first electrode 155a is higher than a top surface 155ba of the second electrode 155b. The storage layer 145 is spaced apart from the second electrode 155b, and a space S is formed between the storage layer 145 and the second electrode 155b. The space S is in a range of about 4 nm to about 30 um. If the space S is less than about 4 nm, carriers stored on the sidewall 146 of the storage layer 145 may too close to the second electrode 155b, and a short problem may occur between the storage layer 145 and the second electrode 155b; if the space S is greater than about 30 um, the second electrode 155b may not read the first electrode 155a. The third electrode 160 is on the bottom surface 110b of the semiconductor substrate 110, i.e., the third electrode 160 and the first electrode 155a (second electrode 155b) are on opposite sides of the semiconductor substrate 110.

Figure 4A:
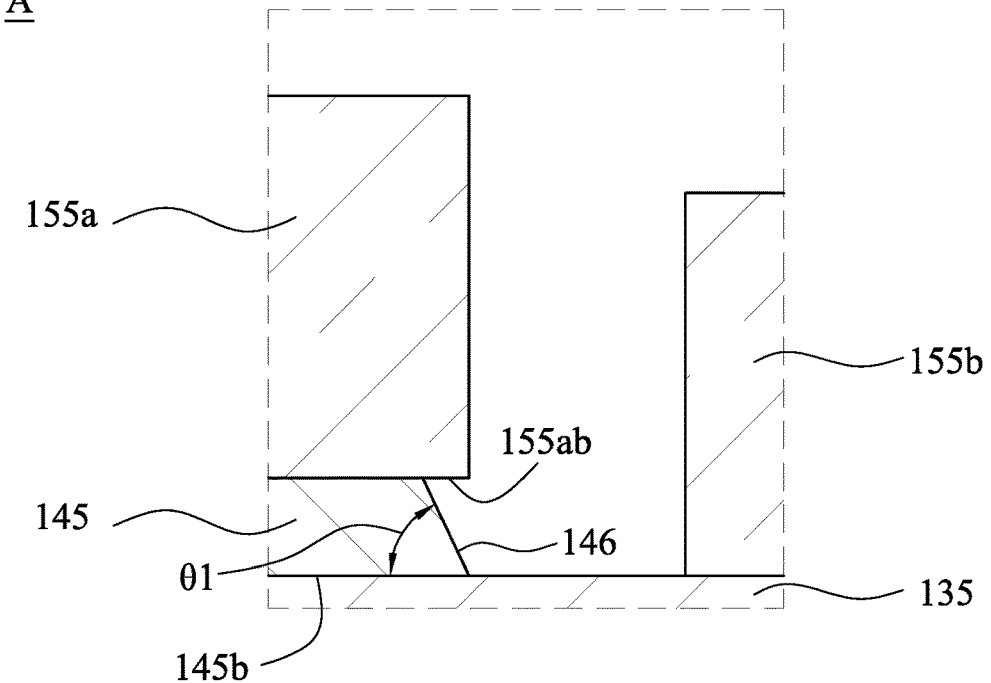
FIGS. 4A-4F are enlarged view of area in FIG. 2E according to various embodiments.
Figure 4B:
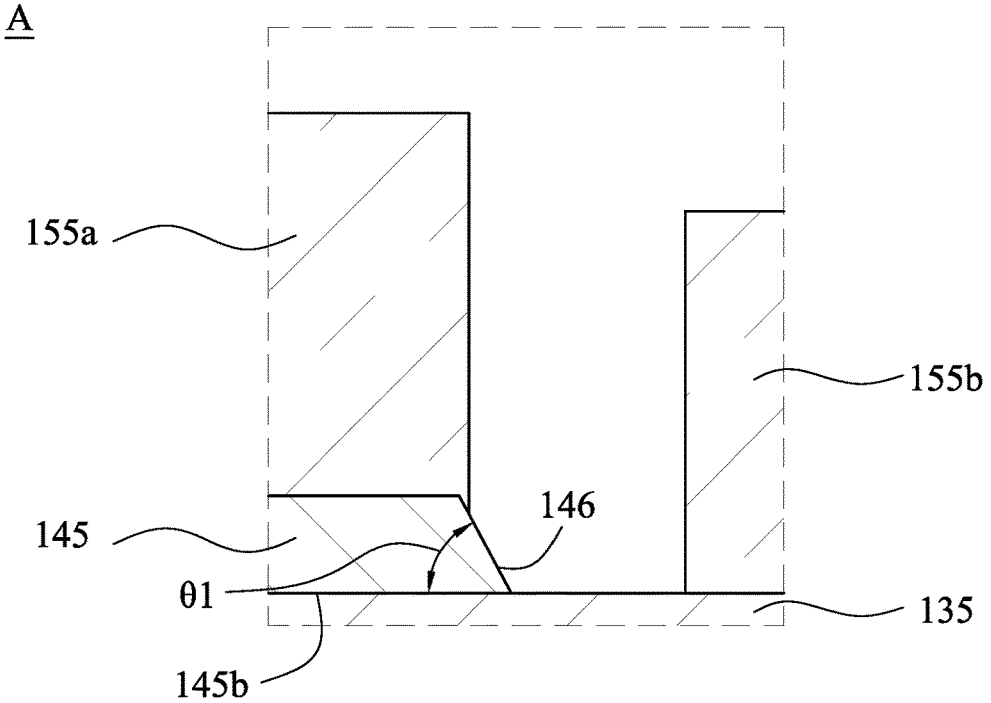

FIGS. 4A-4F are enlarged view of area A in FIG. 2E according to various embodiments. In FIGS. 4A and 4B, the storage layer 145 may be made of amorphous high-k material and patterned by wet etching, such that sidewalls 146 of the storage layer 145 are inclined. In other words, the sidewall 146 of the storage layer 145 and a bottom surface 145b form an acute angle θ1. The sidewalls 146 of the storage layer 145 are inclined, such that the surface area thereof is increased and more broken bonds are formed thereon. The more broken bonds are benefit for storing more carriers on the sidewalls 146. In FIG. 4A, the storage layer 145 exposes a portion of the bottom surface 155ab of the first electrode 155a. In FIG. 4B, the first electrode 155a is in contact with a portion of the sidewalls 146 of the storage layer 145.

Figure 4C:
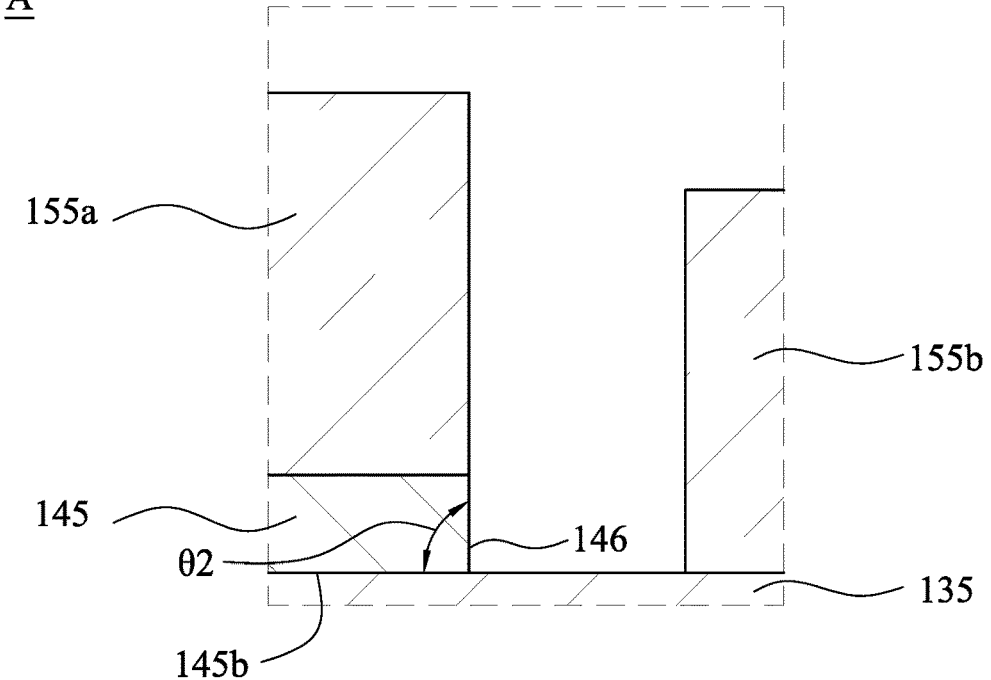
Figure 4D:
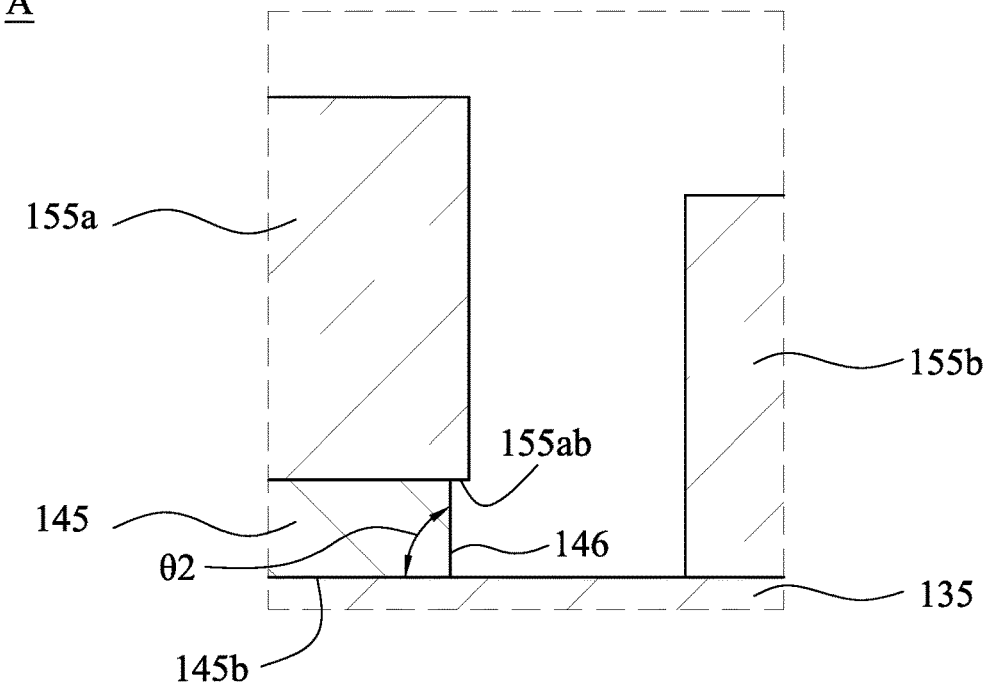

In FIGS. 4C and 4D, the storage layer 145 may be made of amorphous high-k material and patterned by dry etching, such that sidewalls 146 of the storage layer 145 are substantially straight and/or vertical. In other words, the sidewall 146 of the storage layer 145 and a bottom surface 145b form a substantially right angle θ2. In FIG. 4C, the storage layer 145 and the first electrode 155a are substantially coterminous. In FIG. 4D, the storage layer 145 exposes a portion of the bottom surface 155ab of the first electrode 155a.

Figure 4E:
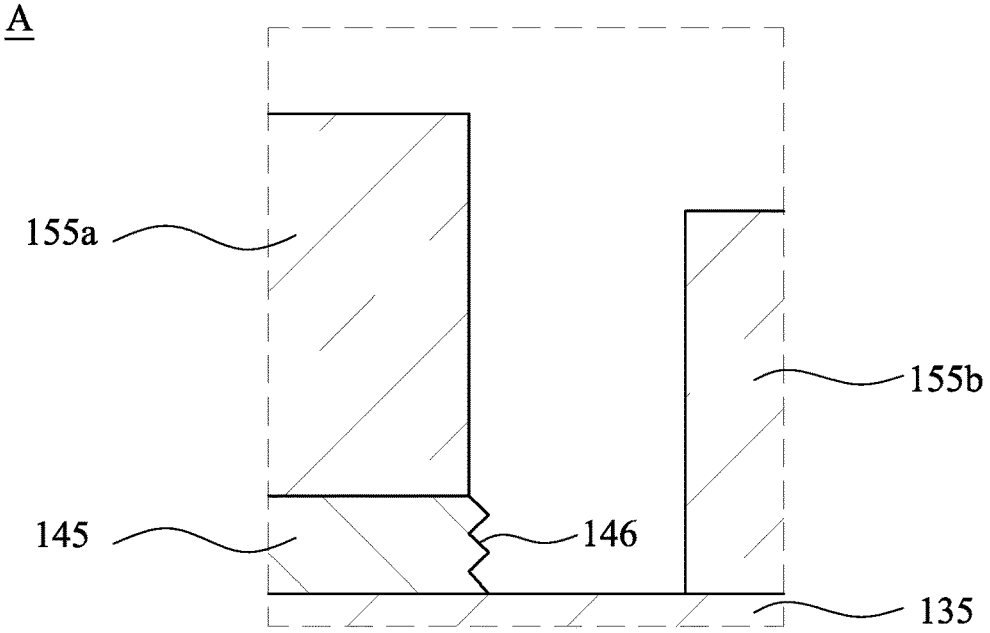
Figure 4F:
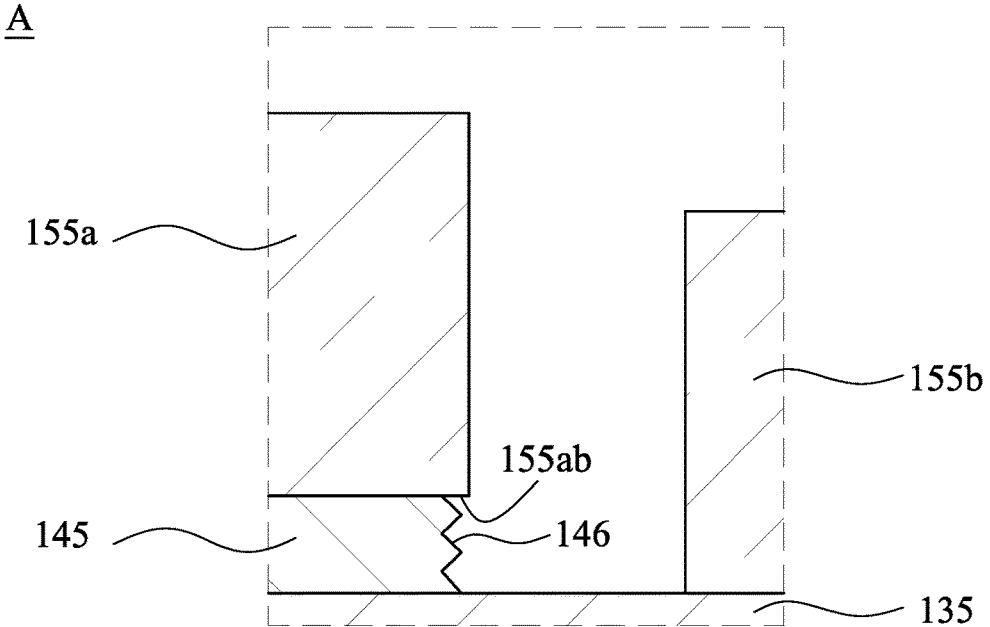

In FIGS. 4E and 4F, the storage layer 145 may be made of polycrystalline high-k material and patterned by wet etching, such that sidewalls 146 of the storage layer 145 have facets, which is determined by the crystalline orientation of the storage layer 145. Thus, the sidewalls 146 are rough in FIGS. 4E and 4F, and the surface area thereof is increased, and more broken bonds to trap electrons are formed thereon. In FIG. 4E, the storage layer 145 and the first electrode 155a have substantially the same width. In FIG. 4F, the storage layer 145 exposes a portion of the bottom surface 155ab of the first electrode 155a.

Reference is made to FIG. 2E, the memory device further includes two transistors (i.e., a writing transistor 100W and a reading transistor 100R). The transistor 100W includes the source/drain regions 116w, the gate electrode 150a, the gate dielectric layer 140, and the first interfacial layer 130. The transistor 100R includes the source/drain regions 116r, the gate electrode 150a, the gate dielectric layer 140, and the first interfacial layer 130.

Figure 2F:
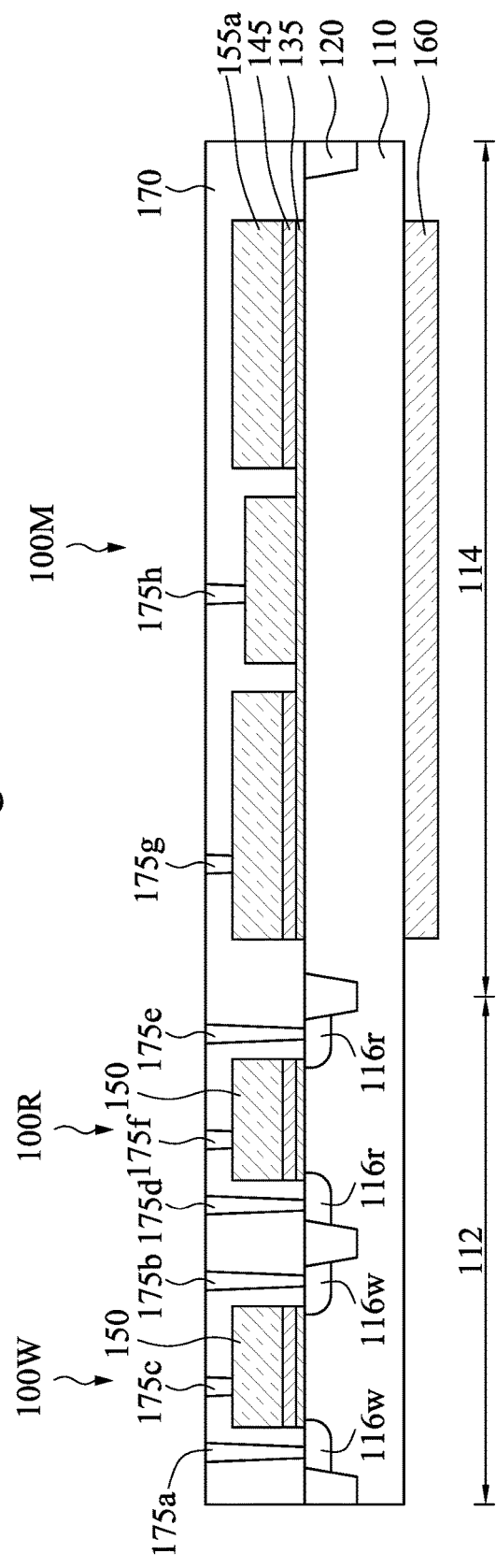

In operation S26 of method M10A, a plurality of contacts 175a-175h are formed over the transistors 100W, 100R, and the memory cell 100M, as shown in FIG. 2F. For example, a first interlayer dielectric (ILD) 170 is formed over the transistors 100W, 100R, and the memory cell 100M. In some embodiments, the first ILD 170 may be formed by depositing a dielectric material over the transistors 100W, 100R, and the memory cell 100M and then a planarization process is performed to the dielectric material. In some embodiments, the deposition process may be chemical vapor deposition (CVD), high-density plasma CVD, spin-on, sputtering, or other suitable methods. In some embodiments, the first ILD 170 includes silicon oxide. In some other embodiments, the first ILD 170 may include silicon oxy-nitride, silicon nitride, or a low-k material.

Then, a plurality of the openings are formed in the first ILD 170, and conductive materials are filled in the openings. The excess portions of the conductive materials are removed to form the contacts 175a-175h. The contacts 175a-175h may be made of tungsten, aluminum, copper, or other suitable materials. The contact 175a is in contact with one of the source/drain regions 116w, the contact 175b is in contact with another of the source/drain regions 116w, the contact 175c is in contact with the gate electrode 150 of the transistor 100W, the contact 175d is in contact with one of the source/drain regions 116r, the contact 175e is in contact with another of the source/drain regions 116r, the contact 175f is in contact with the gate electrode 150 of the transistor 100R, the contact 175g is in contact with the first electrode 155a of the memory cell 100M, and the contact 175h is in contact with the second electrode 155b of the memory cell 100M.

Figure 2G:
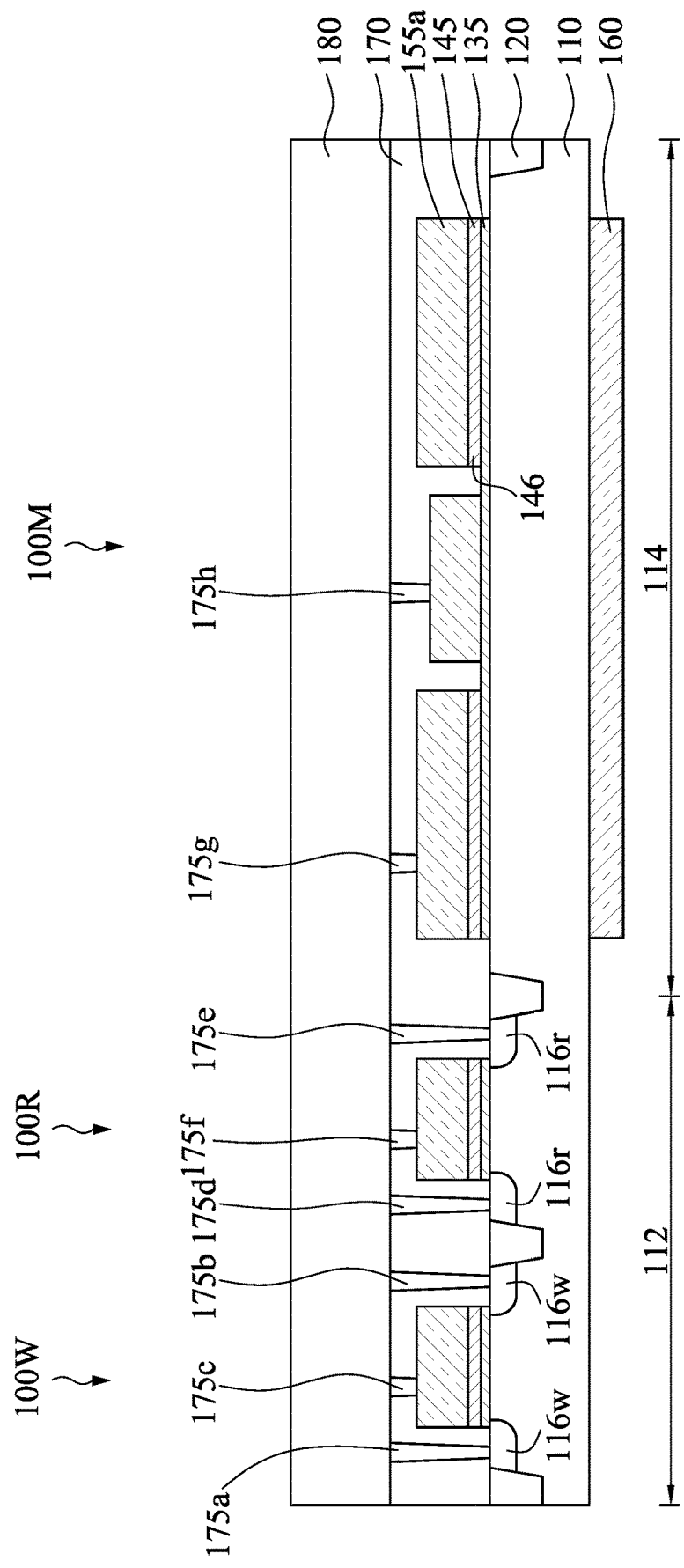

In operation S28 of method M10A, an inter-metal dielectric (IMD) layer 180 is formed to interconnect the transistors 100W, 100R, and the memory cell 100M, as shown in FIG. 2G. The IMD layer 180 may provide electrical interconnection between the transistors 100W, 100R, and the memory cell 100M as well as structural support for the various features of structures formed thereon during many fabrication process operations. In some embodiments, the IMD layer 180 may be silicon oxide, low-k silicon oxide such as a porous silicon oxide layer, other suitable interlayer dielectric (ILD) material, other suitable inter-metal dielectric material, combinations thereof, or the like. In some embodiments, the IMD layer 180 is a low-k dielectric layer made from extra low-k materials, extreme low-k materials, combinations thereof, or the like. In some embodiments, the IMD layer 180 may have a dielectric constant lower than 2.4. In some embodiments, the IMD layer 180 is made using diethoxymethylsilane (mDEOS) or the like as a precursor gas in a chemical vapor deposition (CVD) process. However, other low-k dielectric materials may be used as well. The IMD layer 180 also includes conductive elements for interconnecting the transistors 100W, 100R, and the memory cell 100M.

For example, the IMD layer 180 include a write word line WWL (see FIG. 5) coupled to the contact 175c, such that the write word line WWL is electrically connected to the gate electrode 150a of the transistor 100W. The IMD layer 180 further include a write bit line WBL (see FIG. 5) coupled to the contact 175a, such that the write bit line WBL is electrically connected to one of the source/drain regions 116w of the transistor 100W. The IMD layer 180 further include a conductive line L1 (see FIG. 5) coupled to the contacts 175b and 175g, such that the conductive line L1 is electrically connected to another of the source/drain regions 116w of the transistor 100W and the first electrode 155a of the memory cell 100M. The IMD layer 180 further include a read word line RWL (see FIG. 5) coupled to the contact 175f, such that the read word line RWL is electrically connected to the gate electrode 150a of the transistor 100R. The IMD layer 180 further include a read bit line RBL (see FIG. 5) coupled to the contact 175d, such that the read bit line RBL is electrically connected to one of the source/drain regions 116r of the transistor 100R. The IMD layer 180 further include a conductive line L2 (see FIG. 5) coupled to the contacts 175e and 175h, such that the conductive line L2 is electrically connected to another of the source/drain regions 116r of the transistor 100R and the second electrode 155b of the memory cell 100M.

In FIG. 2G, the memory device includes a memory cell 100M, a writing transistor 100W, and a reading transistor 100R. The writing transistor 100W is electrically connected to the first electrode 155a of the memory cell 100M, and the reading transistor 100R is electrically connected to the second electrode 155b of the memory cell 100M. The storage layer 100M has a sidewall 146 facing the second electrode 155b. Since the sidewall 146 is formed by an etching process, broken bonds may be formed on the sidewall 146 to trap electrons. The trapped electrons may form a capacitor with the second electrode 155b, and the capacitance thereof is determined by the amount of the trapped electrons. With different distinct capacitances, the second electrode 155b may sense different distinct currents when different voltages are applied to the first electrode 155a. Thus, a multi-states (more than two states) memory cell 100M is provided.

Figure 5:
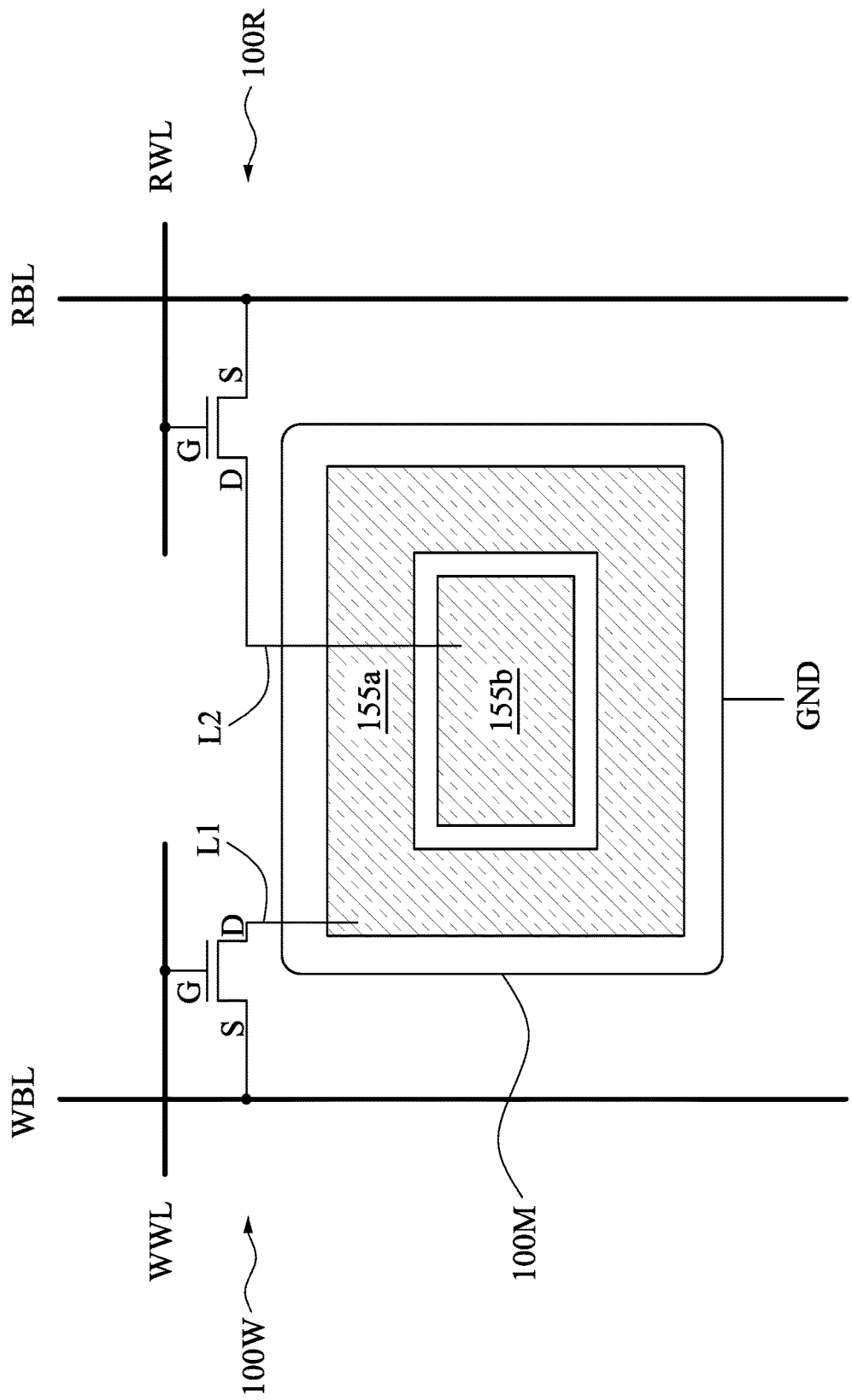
FIG. 5 is a schematic drawing illustrating an exemplary memory circuit according to some embodiments of the present disclosure.

FIG. 5 is a schematic drawing illustrating an exemplary memory circuit according to some embodiments of the present disclosure. In FIG. 5, the memory circuit includes a memory cell 100M, transistors 100W and 100R, a write word line WWL, a write bit line WBL, a read word line RWL, a read bit line RBL, and a ground GND. The gate terminal G of the transistor 100W is coupled to the write word line WWL, the source terminal S of the transistor 100W is coupled to the write bit line WBL, and the drain terminal D of the transistor 100W is coupled to the first electrode 155a of the memory cell 100M. The gate terminal G of the transistor 100R is coupled to the read word line RWL, the source terminal S of the transistor 100R is coupled to the read bit line RBL, and the drain terminal D of the transistor 100R is coupled to the second electrode 155b of the memory cell 100M. The third electrode 160 (see FIG. 2G) of the memory cell 100M is coupled to the ground GND.

The memory cell 100M has three different operations: writing when updating the contents, erasing when erasing the updated contents, and reading when the data has been requested. The memory cell 100M performs the three different operations (write, erase, read) as follows:

Writing—The start of a write cycle of the memory cell 100M begins by applying the value to be written to the write word line WWL and the write bit line WBL. If a state is desired to be stored, a negative voltage $-V1$ is applied to the write bit line WBL and a positive voltage V2 is applied to the write word line WWL, i.e. setting the write bit line WBL to the negative voltage $-V1$ and the write word line WWL to the positive voltage V2. The transistor 100W is thus turned on (by the write word line WWL), and the carriers (electrons) passes through the transistor 100W to the first electrode 155a of the memory cell 100M. Portions of the electrons are stored in the storage layer 145, and another portions of the electrons are stored (trapped) on the sidewalls 146 (see FIG. 2G) of the storage layer 145. As such, the sidewalls 146 may have an ability to store more carriers when the sidewall surface area is large. When the negative voltage $-V1$ is more negative, the amount of the electrons on the sidewalls 146 is exponentially increased, and this exponentially difference can be considered as different states. As such, with different applied (negative) voltages and/or different durations of the voltages of the write bit line WBL, the storage layer 145 is at different states. In some embodiments, the memory cell 100M in various embodiments of the present disclosure can provide more than two states, e.g., four or more states. For example, the memory cell 100M may store different distinct states when the applied voltages ($-V1$) are about $-0.5V$, about $-1.5V$, about $-2.5V$ and about $-3.5V$ for about 5 seconds. In the writing operation, a voltage V0 equals to 0 is applied to the read word line RWL, such that the transistor 100R is turned off, and the second electrode 155b is floating.

Erasing—The start of an erase cycle of the memory cell 100M begins by applying the value to be erased to the write word line WWL and the write bit line WBL. If the memory cell 100M is desired to be erased, a positive voltage V3 is applied to the write bit line WBL and a positive voltage V2 is applied to the write word line WWL, i.e. setting the write bit line WBL to the positive voltage V3 and the write word line WWL to the positive voltage V2. The transistor 100W is thus turned on (by the write word line WWL), and the carriers (holes) passes through the transistor 100W to the first electrode 155a of the memory cell 100M. The carriers (holes) thus erase the electrons initially stored in the storage layer 145 and on its sidewalls 146. In some embodiments, the voltage V3 may be about 3V for about 10 seconds. In the erasing operation, a voltage V0 equals to 0 is applied to the read word line RWL, such that the transistor 100R is turned off, and the second electrode 155b is floating.

Reading—The start of a read cycle of the memory cell 100M begins by applying the value to be read to the read word line RWL and the read bit line RBL. If the memory cell 100M is desired to be read, a positive voltage V4 is applied to the read bit line RBL and a positive voltage V5 is applied to the read word line RWL, i.e. setting the read bit line RBL to the positive voltage V4 and the read word line RWL to the positive voltage V5. In some embodiments, the positive voltage V4 is greater than a tunnel diode saturation voltage of the storage layer 145. For example, the voltage V4 may be about 1V. The transistor 100R is thus turned on (by the read word line RWL), and the carriers (holes) passes through the transistor 100R to the second electrode 155b of the memory cell 100M. Since the positive voltage V4 makes the storage layer 145 be in a saturation state, the carriers in the storage layer 145 senses the trapped electrons on the sidewall 146 of the storage layer 145 and also starts to tunnel through the tunneling layer 135 to the third electrode. Stated in another way, once the second electrode 155b enters the saturation region, current can be modulated by the minority carriers at the interface between the tunneling layer 135 and the semiconductor substrate 110. The intensity of the tunneling current reflects the state of the storage layer 145, i.e., less amounts of induced inversion electrons on the top surface of the semiconductor substrate 110 lead to minor current while more amounts lead to greater current. In the reading operation, a voltage V0 equals to 0 is applied to the write word line WWL, such that the transistor 100W is turned off, and the first electrode 155a is floating. In some embodiments, since the electric field in a high-k material (e.g., the storage layer 145 in this case) is weaker than which in a low-k dielectric layer, the carriers stored in the storage layer 145 is less disturbed while the first electrode 155a is floating. This can be seen from the improved retention performance.

In some embodiments, the memory devices mentioned above had been tested for 1000 cycles and still worked normally. The difference of the charge amount stored in the storage layer 145 can be sensed for more than 3000 seconds. The sidewall 146 of the storage layer 145 (facing the second electrode 155b) increases the states of the memory cell 100M. It is believed that the memory devices according to various embodiments can meet the requirement of non-volatile memory with good fabrication techniques.

Figure 6A:
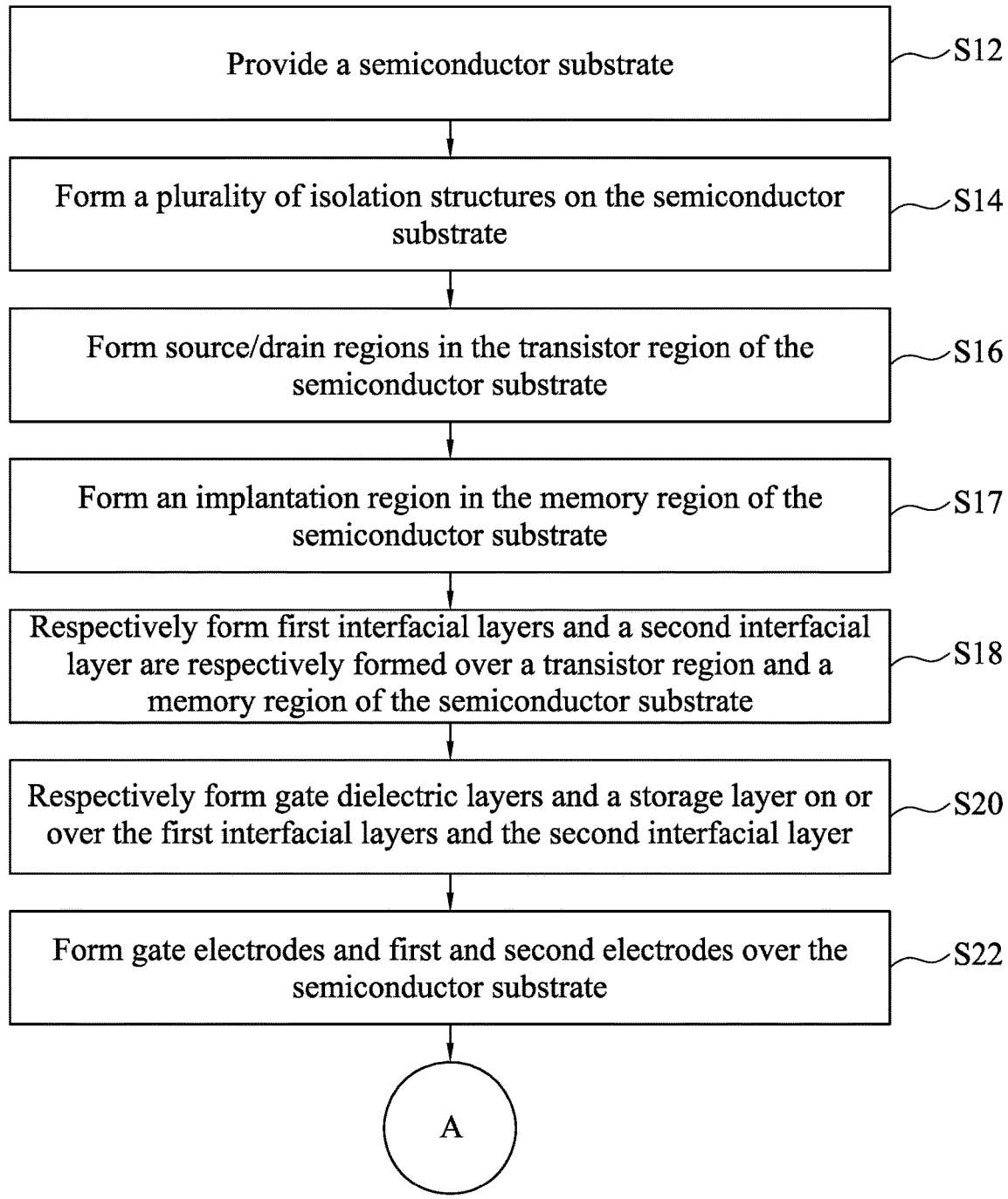
FIGS. 6A and 6B are a flowchart of a method for making a memory device according to aspects of the present disclosure in various embodiments.
Figure 6B:
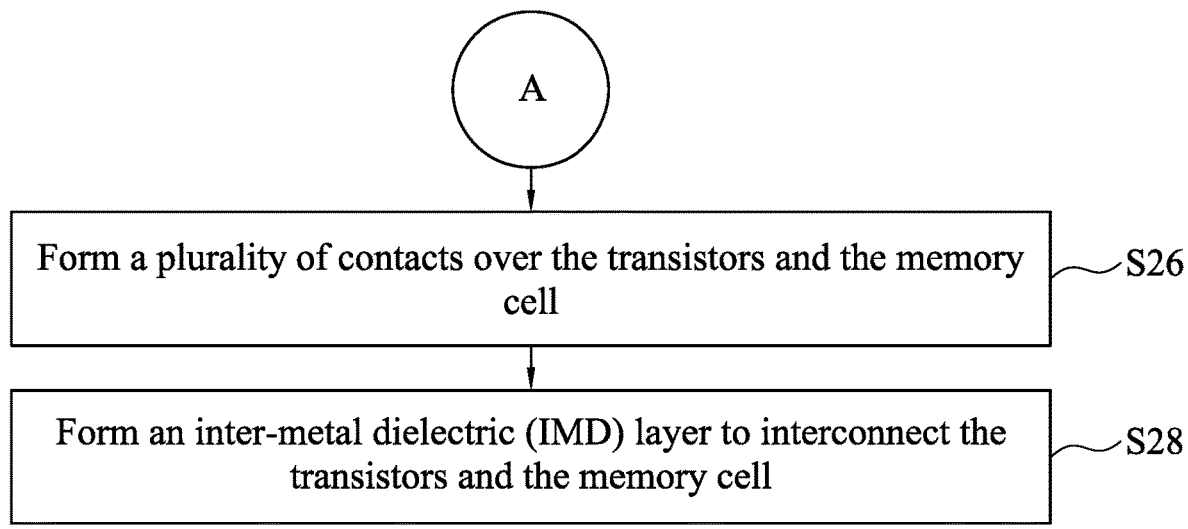

FIGS. 6A and 6B are a flowchart of a method M10B for making a memory device according to aspects of the present disclosure in various embodiments. Various operations of the method M10B are discussed in association with cross-section diagrams FIGS. 7A-7H. Throughout the various views and illustrative embodiments, like reference numbers are used to designate like elements. The present embodiment may repeat reference numerals and/or letters used in FIGS. 2A-2G. This repetition is for the purpose of simplicity and clarity and does not in itself dictate a relationship between the various embodiments and/or configurations discussed. In the following embodiments, the structural and material details described before are not repeated hereinafter, and only further information is supplied to perform the semiconductor devices of FIGS. 7A-7H.

Figure 7A:
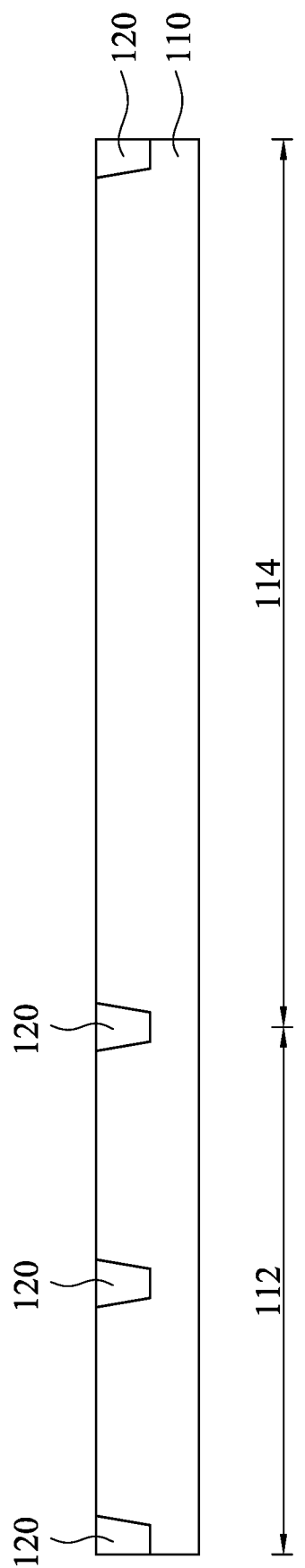
Figure 7B:
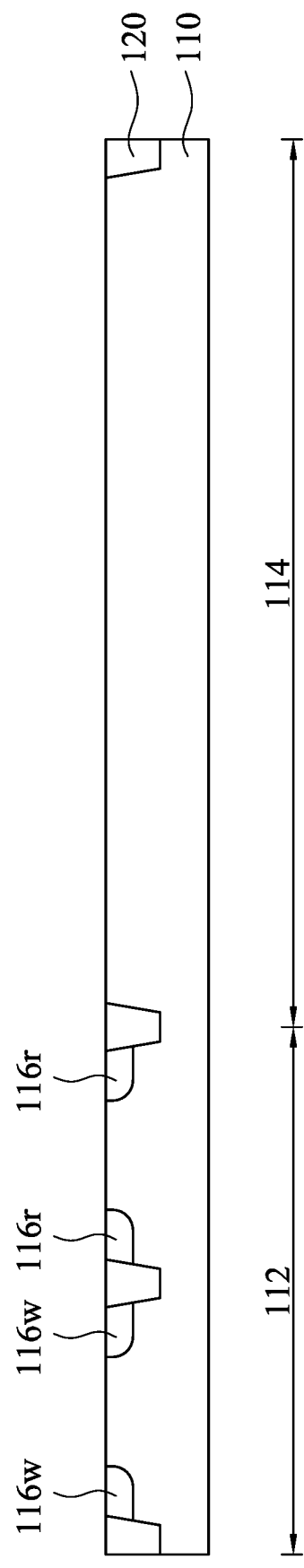
Figure 7C:
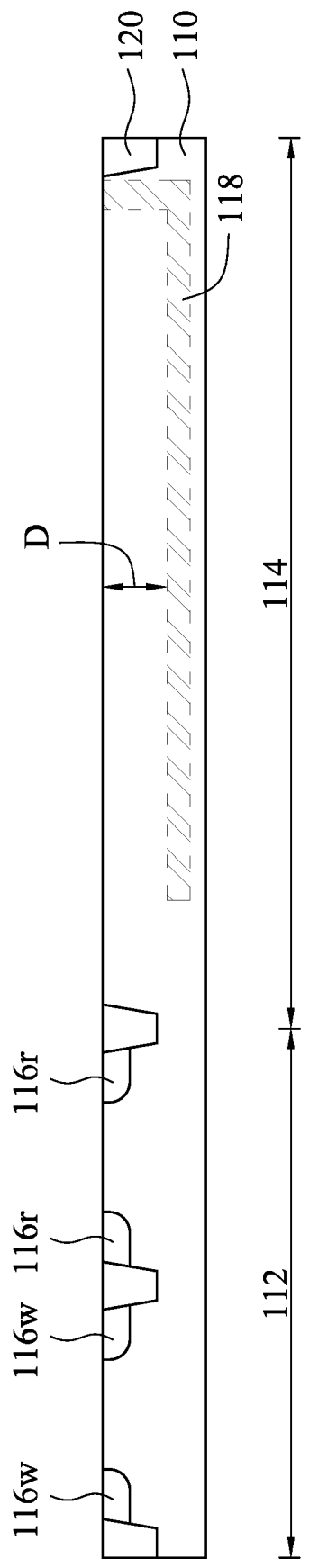

In operation S12 of method M10B, a semiconductor substrate 110 is provided, as shown in FIG. 7A. In operation S14 of method M10B, a plurality of isolation structures 120 are formed on the semiconductor substrate 110, as shown in FIG. 7A. In operation S16 of method M10B, source/drain regions 116w and 116r are formed in the transistor region 112 of the semiconductor substrate 110, as shown in FIG. 7B. In operation S17 of method M10B, an implantation region 118 is formed in the memory region 114 of the semiconductor substrate 110, as shown in FIG. 7C. In some embodiments, the implantation region 118 is served as the third electrode 160 shown in FIG. 2E. Specifically, another mask layer (may be a hard mask layer) may be formed over the top surface of the semiconductor substrate 110, and an opening is formed in the mask layer. An implantation process is then performed to introduce impurities into the memory region 114 of the semiconductor substrate 110 to form the implantation region 118, and the patterned mask layer may act as a mask to substantially prevent the impurities from being implanted into other regions of the semiconductor substrate 110. The implantation process may be a low energy implantation through the semiconductor substrate 110 to a desirable depth D below the substrate surface (e.g., about 1 um to about 10 um below the substrate surface). The impurities may be p-type impurities or n-type impurities. The p-type impurities may be boron, $BF_2$, or the like, and the n-type impurities may be phosphorus, arsenic, or the like. Then, the photoresist and the patterned mask layer are removed. In some embodiments, the source/drain regions 116w and 116r may have n-type impurities, and the implantation region 118 may have p-type impurities, or vise versa.

Figure 7D:
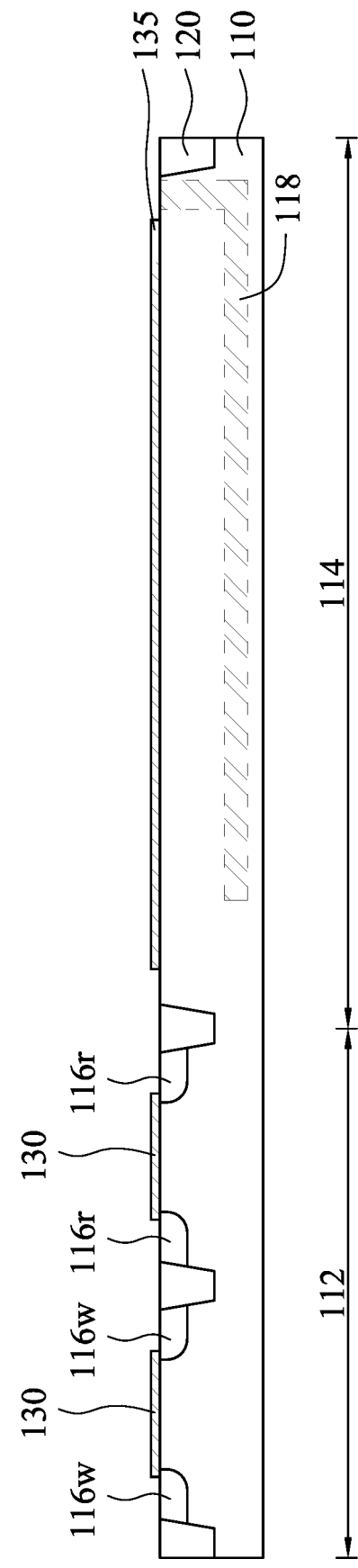
Figure 7G:
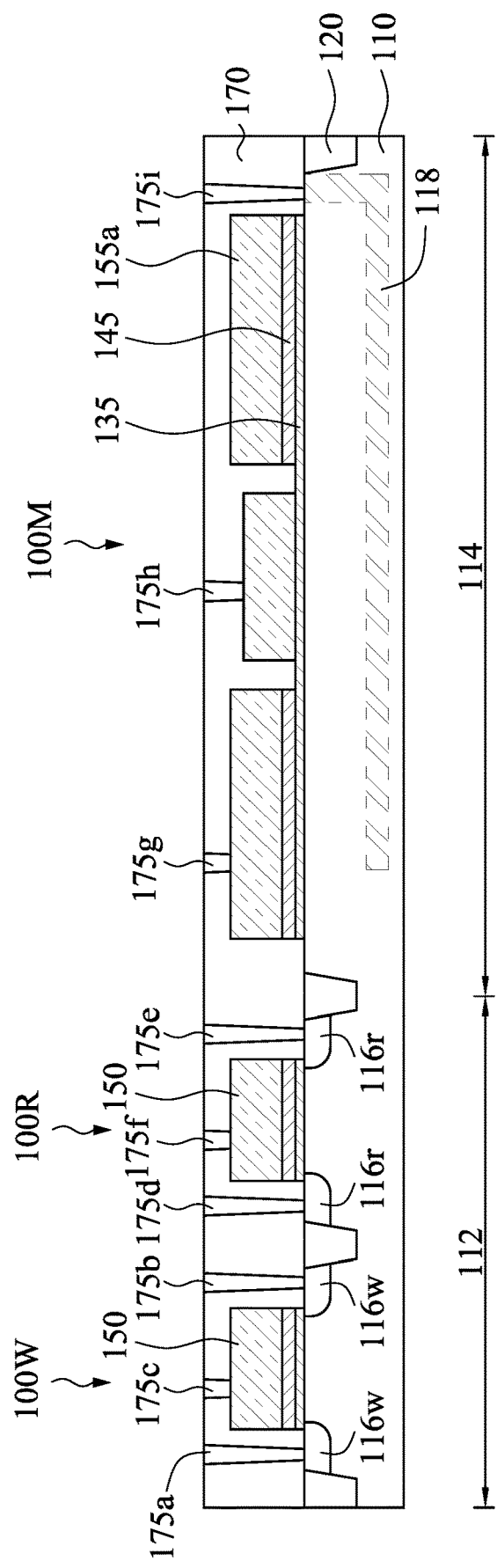

In operation S18 of method M10B, first interfacial layers 130 and a second interfacial layer 135 are respectively formed over the transistor region 112 and the memory region 114 of the semiconductor substrate 110, as shown in FIG. 7D. In FIG. 7D, the second interfacial layer 135 is spaced apart from the implantation region 118. In operation S20 of method M10B, gate dielectric layers 140 and a storage layer 145 are respectively formed on or over the first interfacial layers 130 and the second interfacial layer 135, as shown in FIG. 7E. In operation S22 of method M10B, gate electrodes 150a and first and second electrodes 155a, 155b are formed over the semiconductor substrate 110, as shown in FIG. 7F. In operation S26 of method M10B, a plurality of contacts 175a-175i are formed over the transistors 100W, 100R, and the memory cell 100M, as shown in FIG. 7G. In FIG. 7G, the contact 175i is in contact with the implantation region 118. In operation S28 of method M10A, an IMD layer 180 is formed to interconnect the transistors 100W, 100R, and the memory cell 100M, as shown in FIG. 7H.

Figure 7H:
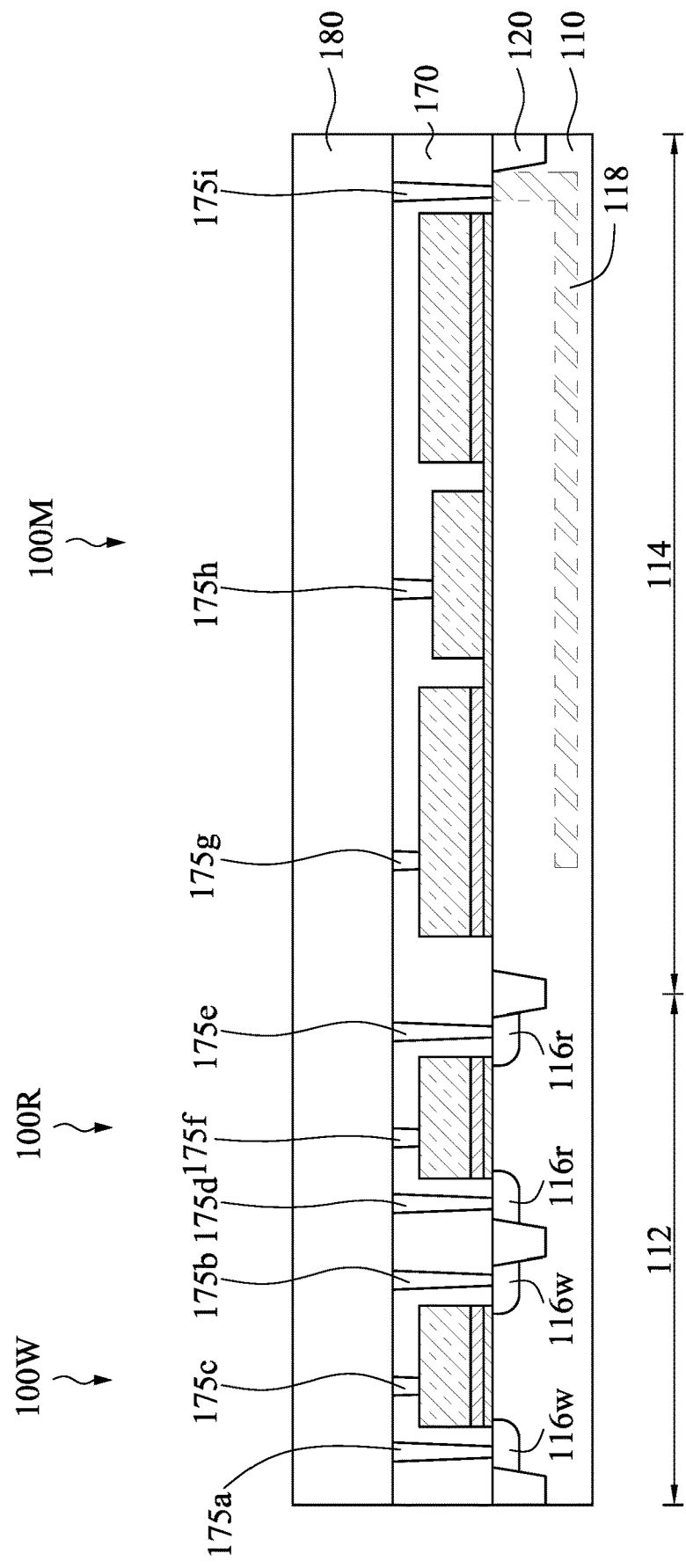

The difference between the memory cells 100M in FIGS. 7H and 2G pertains to the third electrode. In FIG. 7H, the third electrode is an implantation region 118 formed in the semiconductor substrate 110. The tunneling current from the second electrode 155b passes through the semiconductor substrate 110 to the implantation region 118, and the current flows to the contact 175i and a ground trace in the IMD layer 180. In some embodiments, if the depth D is less than about 1 um, the depletion region in the semiconductor substrate 110 and between the second electrode 155b and the implantation region 118 will stop extending; if the depth D is greater than about 10 um, the reading voltage may be increased.

Figure 8A:
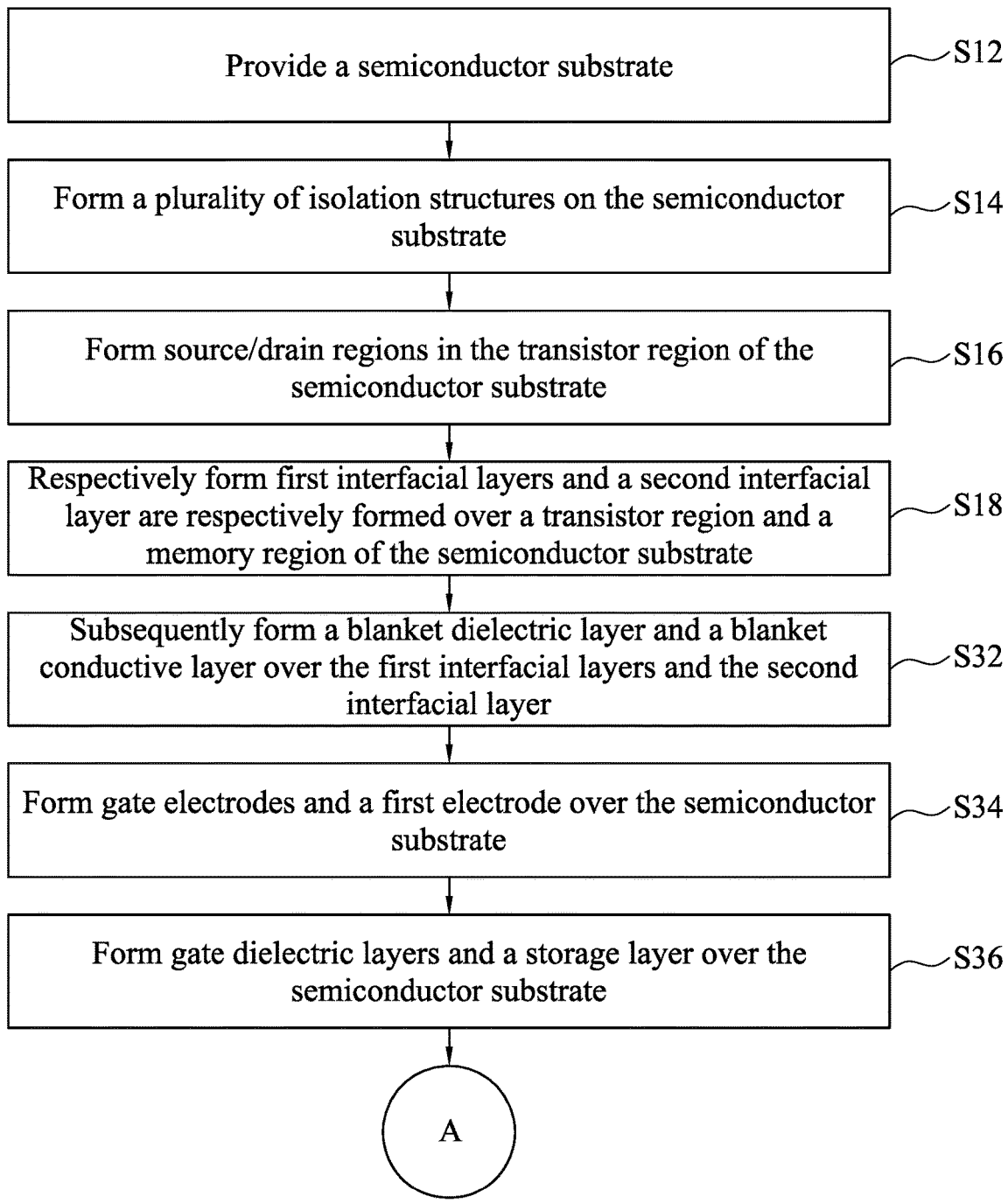
FIGS. 8A and 8B are a flowchart of a method for making a memory device according to aspects of the present disclosure in various embodiments.
Figure 8B:
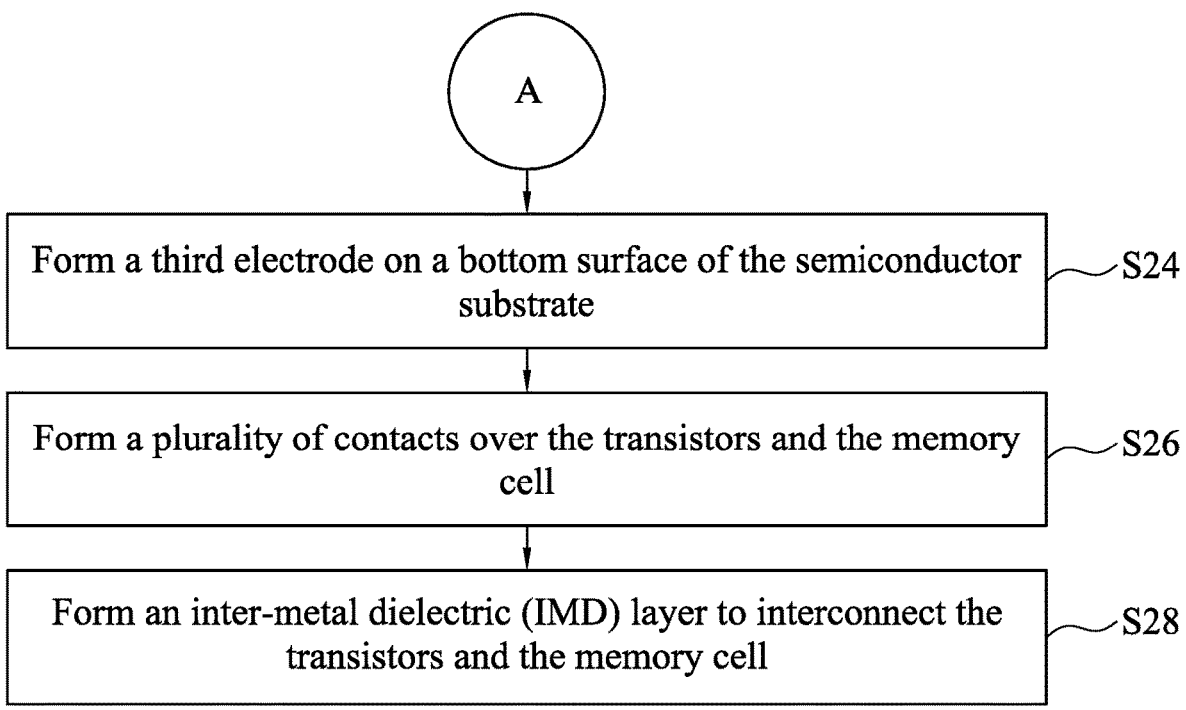

FIGS. 8A and 8B are a flowchart of a method M10C for making a memory device according to aspects of the present disclosure in various embodiments. Various operations of the method M10C are discussed in association with cross-section diagrams FIGS. 9A-9I. Throughout the various views and illustrative embodiments, like reference numbers are used to designate like elements. The present embodiment may repeat reference numerals and/or letters used in FIGS. 2A-2G. This repetition is for the purpose of simplicity and clarity and does not in itself dictate a relationship between the various embodiments and/or configurations discussed. In the following embodiments, the structural and material details described before are not repeated hereinafter, and only further information is supplied to perform the semiconductor devices of FIGS. 9A-9I.

In operation S12 of method M10C, a semiconductor substrate 110 is provided, as shown in FIG. 9A. In operation S14 of method M10C, a plurality of isolation structures 120 are formed on the semiconductor substrate 110, as shown in FIG. 9A. In operation S16 of method M10C, source/drain regions 116w and 116r are formed in the transistor region 112 of the semiconductor substrate 110, as shown in FIG. 9B. In operation S18 of method M10C, first interfacial layers 130 and a second interfacial layer 135 are respectively formed over the transistor region 112 and the memory region 114 of the semiconductor substrate 110, as shown in FIG. 9C. In operation S32 of method M10C, a blanket dielectric layer 140' and a blanket conductive layer 150' are subsequently formed over the first interfacial layers 130 and the second interfacial layer 135, as shown in FIG. 9D. In some embodiments, the blanket dielectric layer 140' have the same material as the dielectric layers 140 and the storage layer 145 mentioned above, and the blanket conductive layer 150' have the same material as the gate electrodes 150a and first and second electrodes 155a, 155b mentioned above.

Figure 9E:
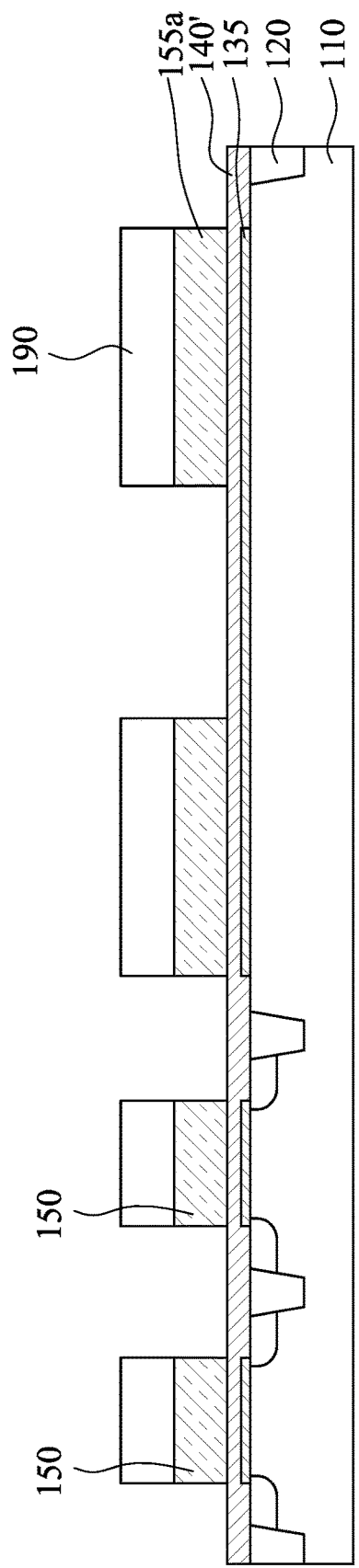

In operation S34 of method M10C, gate electrodes 150a and a first electrode 155a are formed over the semiconductor substrate 110, as shown in FIG. 9E. In some embodiments, a patterned photoresist 190 is formed over the blanket conductive layer 150', and the blanket conductive layer 150' is patterned using the patterned photoresist 190 as a mask to form the gate electrodes 150a and the first electrode 155a on the blanket dielectric layer 140'.

Figure 9F:
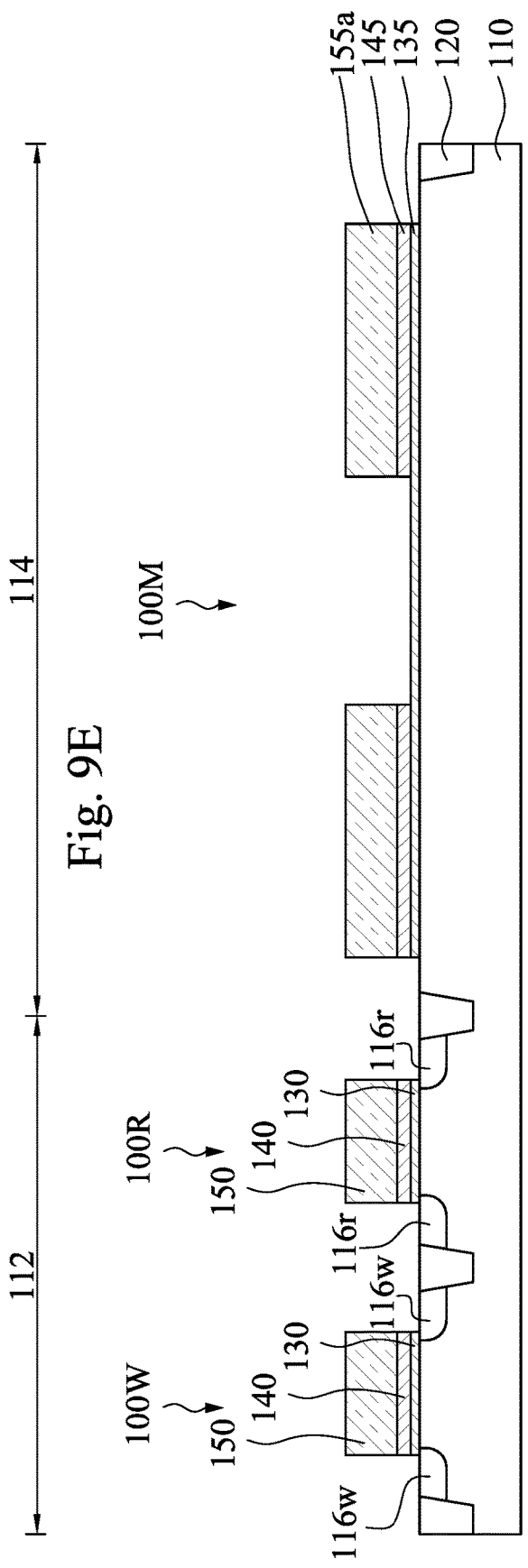

In operation S36 of method M10C, gate dielectric layers 140 and a storage layer 145 are formed over the semiconductor substrate 110, as shown in FIG. 9F. In some embodiments, the blanket dielectric layer 140' is patterned using the patterned photoresist 190, the gate electrodes 150a, and the first electrode 155a as masks to form the gate dielectric layers 140 and the storage layer 145.

In operation S38 of method M10C, a second electrode 155b is formed over the second interfacial layer 135, as shown in FIG. 9G. For example, another mask is formed over the structure of FIG. 9F, and an opening is formed to expose the accommodating area 147 defined by the storage layer 145. Then, the second electrode 155b is formed in the opening and on the second interfacial layer 135, and the mask is removed after the formation of the second electrode 155b.

Figure 9I:
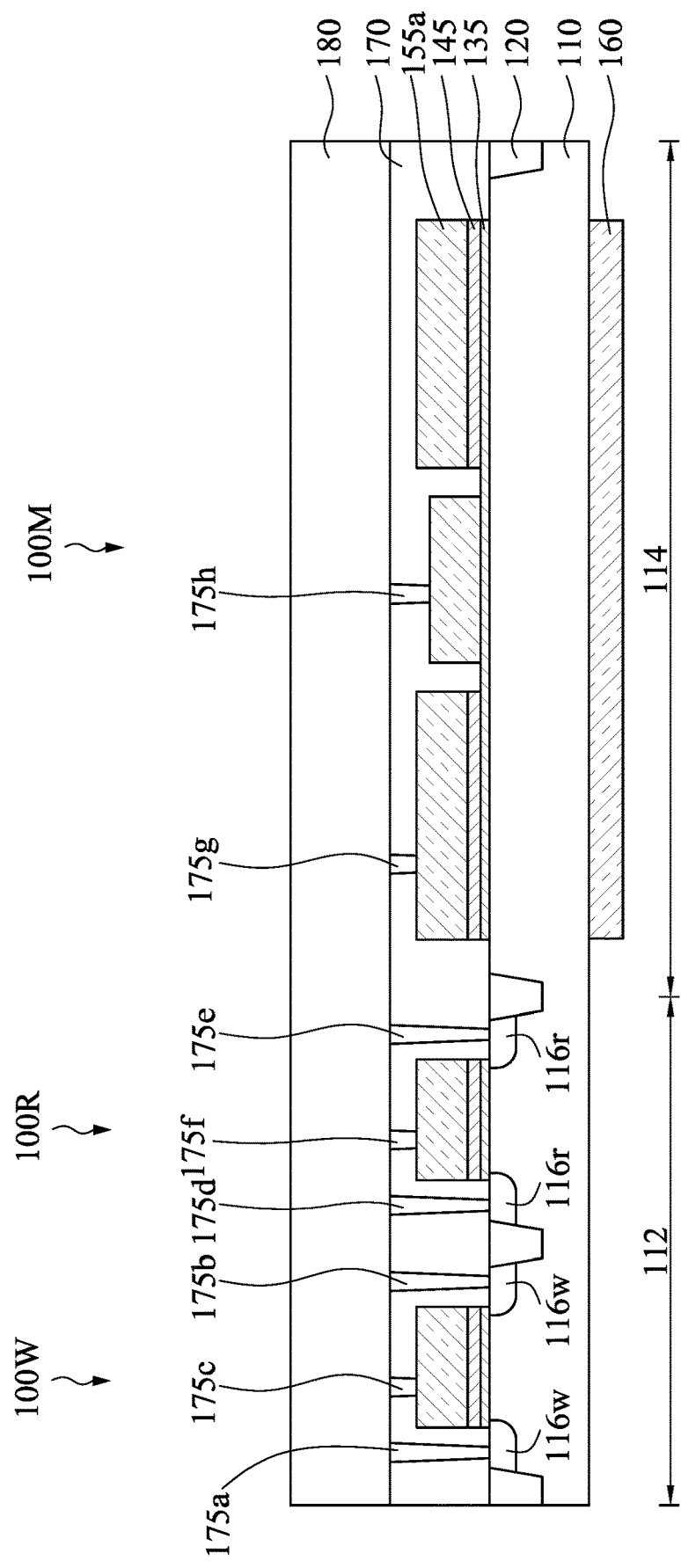

In operation S24 of method M10C, a third electrode 160 is formed on a bottom surface 110b of the semiconductor substrate 110, as shown in FIG. 9G. In operation S26 of method M10C, a plurality of contacts 175a-175h are formed over the transistors 100W, 100R, and the memory cell 100M, as shown in FIG. 9H. In operation S28 of method M10C, an IMD layer 180 is formed to interconnect the transistors 100W, 100R, and the memory cell 100M, as shown in FIG. 9I.

Figure 10A:
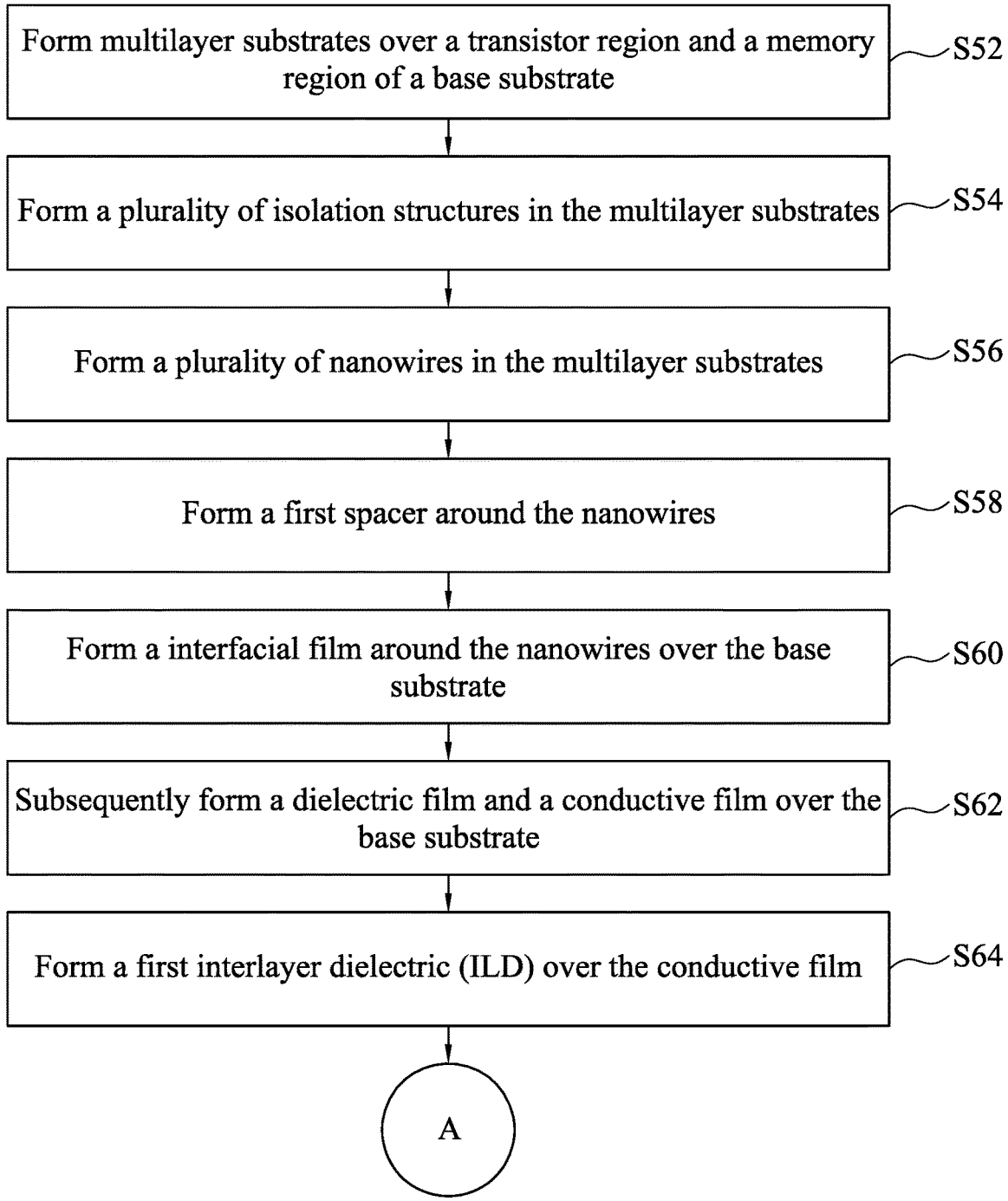
FIGS. 10A and 10B are a flowchart of a method for making a memory device according to aspects of the present disclosure in various embodiments.
Figure 10B:
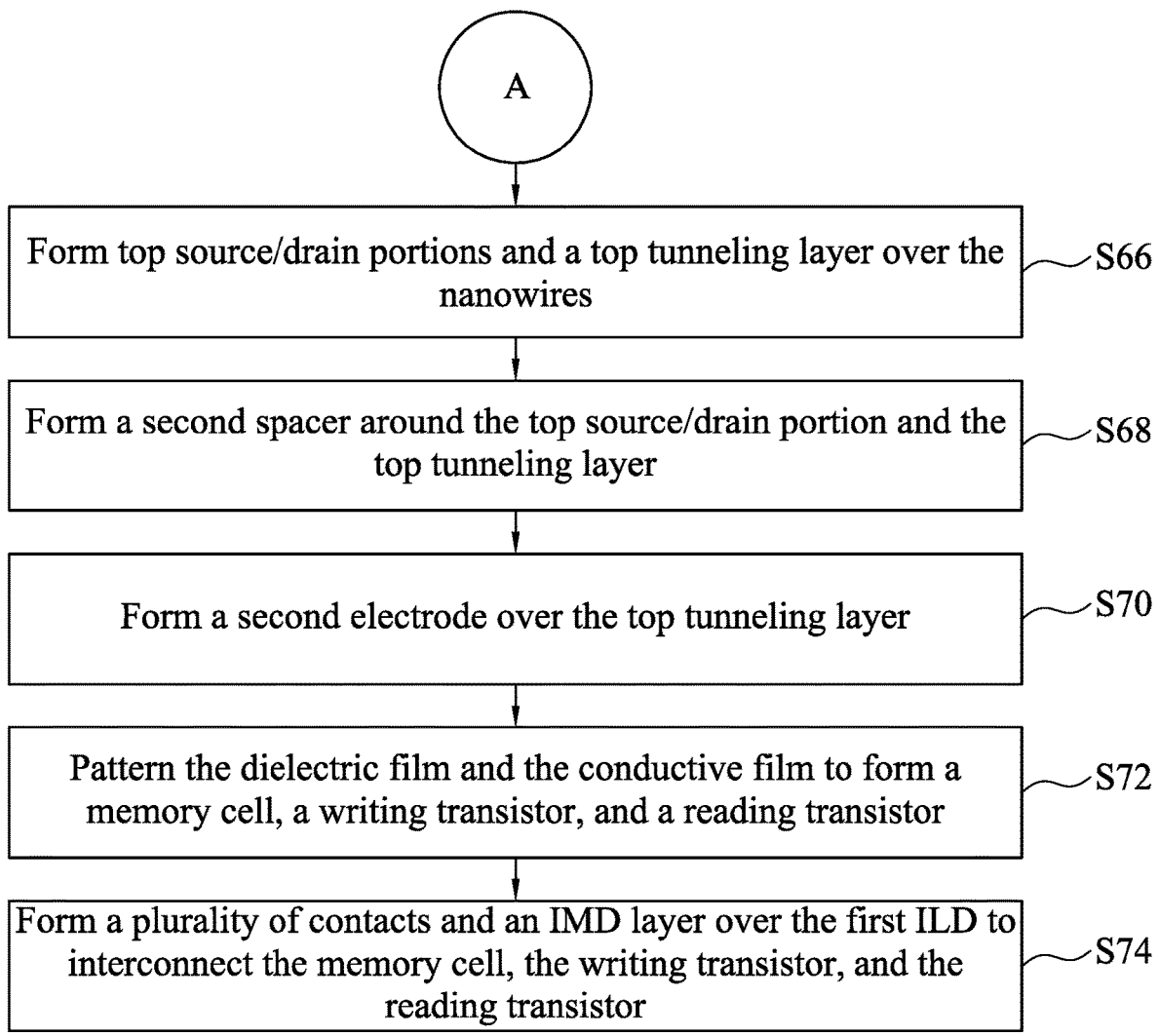
Figure 11A:
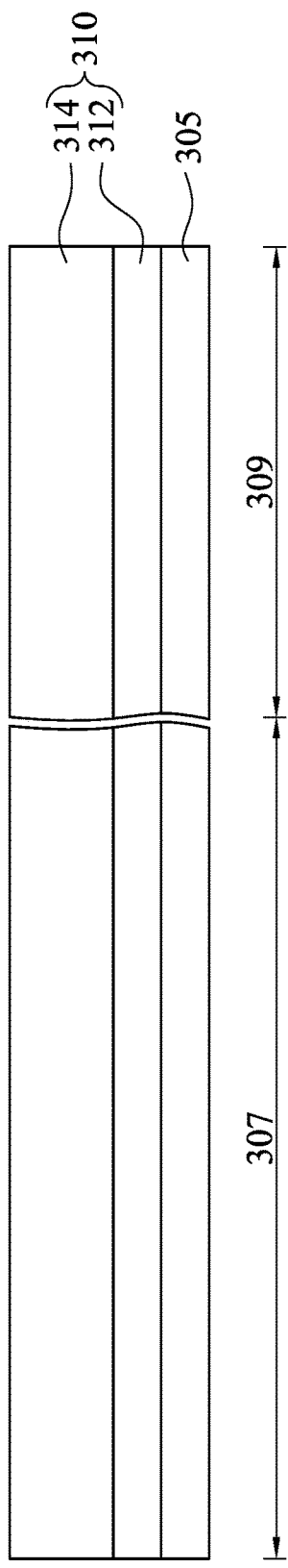

FIGS. 10A and 10B are a flowchart of a method M50 for making a memory device according to aspects of the present disclosure in various embodiments. Various operations of the method M50 are discussed in association with cross-section diagrams FIGS. 11A-11M. Throughout the various views and illustrative embodiments, like reference numbers are used to designate like elements. In operation S52 of method M50, a multilayer substrate 310 is formed over a base substrate 305, as shown in FIG. 11A. The multilayer substrate 310 includes various substrate layers 312 and 314. The substrate layer 312 may be a high-dopant region (e.g., having a concentration of n-type or p-type dopants of about $1\times10^{20}$ cm$^{-3}$ to about $1\times10^{22}$ cm$^{-3}$ or even greater) of the base substrate 305. Alternatively, the substrate layer 312 may be formed over the base substrate 305 using an epitaxy process, such as metal-organic (MO) chemical vapor deposition (CVD), molecular beam epitaxy (MBE), liquid phase epitaxy (LPE), vapor phase epitaxy (VPE), selective epitaxial growth (SEG), combinations thereof, and the like.

The base substrate 305 may be a semiconductor substrate, such as a bulk semiconductor, a semiconductor-on-insulator (SOI) substrate, or the like, which may be doped (e.g., with a p-type or an n-type dopant) or undoped. In some embodiments, an SOI substrate includes a layer of a semiconductor material formed on an insulator layer. The insulator layer may be, for example, a buried oxide (BOX) layer, a silicon oxide layer, or the like. The insulator layer is provided on a substrate, e.g., a silicon or glass substrate. Other substrates, such as a multi-layered or gradient substrate may also be used. In some embodiments, the semiconductor material of the base substrate 305 may include silicon (Si); germanium (Ge); a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate layer 314 may be formed over the substrate layer 312. In some embodiments, various epitaxies may be performed to form various substrate layers 312 and 314. Any suitable epitaxy processes may be used, such as by MO CVD, MBE, LPE, VPE, SEG, combinations thereof, or the like. The substrate layer 314 may be a lightly-doped or undoped layer (e.g., having a dopant concentration less than about $1\times10^{18}$ cm$^{-3}$). Furthermore, the substrate layer 314 may be doped with dopant of a different type than the substrate layer 312. The implantation of dopants in the substrate layers 312 and 314 may be achieved using any suitable method.

Figure 11B:
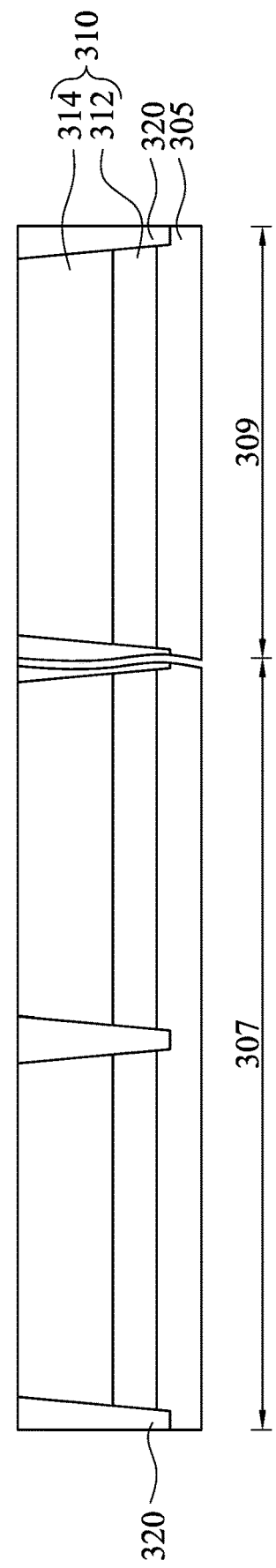

In operation S54 of method M50, a plurality of isolation structures 320 are formed in the multilayer substrates 310a and 310b, as shown in FIG. 11B. In some embodiments, the isolation structures 320 may be formed by patterning openings in the multilayer substrate 310 and filling the openings with a dielectric material. For example, a hard mask and/or photoresist (not illustrated) may be disposed over the multilayer substrate 310. The hard mask may include one or more oxide (e.g., silicon oxide) and/or nitride (e.g., silicon nitride) layers to prevent damage to the underlying multilayer substrate 310 during patterning, and the hard mask may be formed using any suitable deposition process, such as, atomic layer deposition (ALD), CVD, high density plasma CVD (HDP-CVD), physical vapor deposition (PVD), and the like. In some embodiments, the isolation structures 320 and 120 (see FIG. 2A) may have the same or similar material.

Figure 11C:
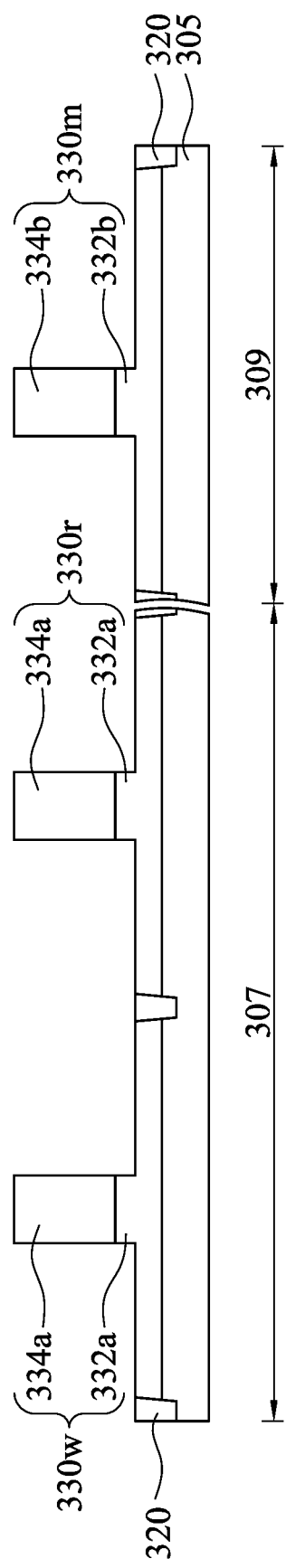

In operation S56 of method M50, a plurality of nanowires (nano-rods, nano-columns, or nanorings) 330w, 330r, and 330m are formed in the multilayer substrate 310, as shown in FIG. 11C. The nanowires 330w and 300r are formed over the transistor region 307 of the base substrate 305, and the nanowire 330m is formed over the memory region 309 of the base substrate 305. More specifically, the multilayer substrate 310 and the isolation structures 320 are further patterned to form the nanowires 330w, 300r, and 330m. The patterning of the nanowires 330w, 300r, and 330m may be done using a combination of photolithography and etching as described above, for example. Each of the nanowires 330w and 300r includes a bottom highly-doped semiconductor portion (i.e., a bottom source/drain portion) 332a and a middle lightly-doped or undoped semiconductor portion (i.e., a channel portion) 334a, and the nanowire 330m includes a bottom highly-doped semiconductor portion 332b and a middle lightly-doped or undoped semiconductor portion 334b. The portions 332a (332b) and 334a (334b) correspond to the substrate layers 312 and 314 respectively. In the (VGAA) transistor 300W and 300R (see e.g., FIG. 11M), the portion 332a is a bottom source/drain portion and the portion 334a is a channel portion. In the memory cell 300M (see e.g., FIG. 11M), the portion 332b is a third electrode and the portion 334b is the semiconductor substrate of the memory cell 300M.

Figure 11D:
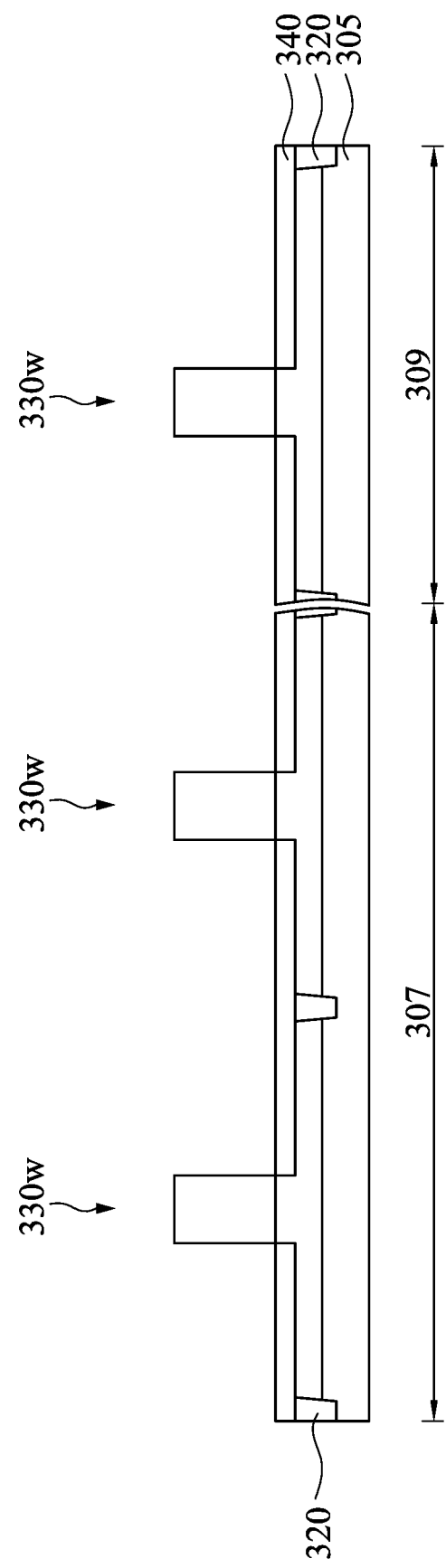

In operation S58 of method M50, a first spacer 340 is formed around the nanowires 330w, 300r, and 330m, as shown in FIG. 11D. The first spacer 340 may also be formed over the isolation structure 320. A top surface of the first spacer 340 may be substantially level with or higher than a top surface of source/drain portion 332a in the nanowires 330w and 330r and the portion 332b in the nanowire 330m. In some embodiments, the first spacer 340 may include a dielectric material, such as silicon nitride, for example, formed using any suitable process, such as, CVD, PVD, ALD, and the like. The deposition of the first spacer 340 may be a conformal process, and an etch back process may be performed to remove excess portions of the first spacer 340 from sidewalls of the portions 334a, 334b, and top surfaces of the nanowires 330w, 330r, and 330m. In the (VGAA) transistors 300W and 300R (see e.g., FIG. 11M), the first spacer 340 may be used to prevent a gate electrode (i.e., the gate electrodes 370a) from contacting the bottom source/drain portion 332a.

In operation S60 of method M50, an interfacial film 350' is formed around the nanowires 330w, 330r, and 330m over the base substrate 305, as shown in FIG. 11E. In some embodiments, the interfacial film 350' may have the same or similar materials to the second interfacial layer 135 shown in FIG. 2C, for example, formed using any suitable process, such as, CVD, PVD, ALD, and the like. The deposition of the interfacial film 350' may be a conformal process.

In operation S62 of method M50, a dielectric film 360' and a conductive film 370' are subsequently formed over the base substrate 305, as shown in FIG. 11F. The dielectric film 360' and the conductive film 370' are formed over the interfacial film 350', such that the dielectric film 360' and the conductive film 370' cover the nanowires 330w, 330r, and 330m. In some embodiments, the dielectric film 360' may have the same or similar materials to the storage layer 145 in FIG. 2D. In some embodiments, the conductive film 370' may have the same or similar materials to the first electrode 150a in FIG. 2G.

Figure 11G:
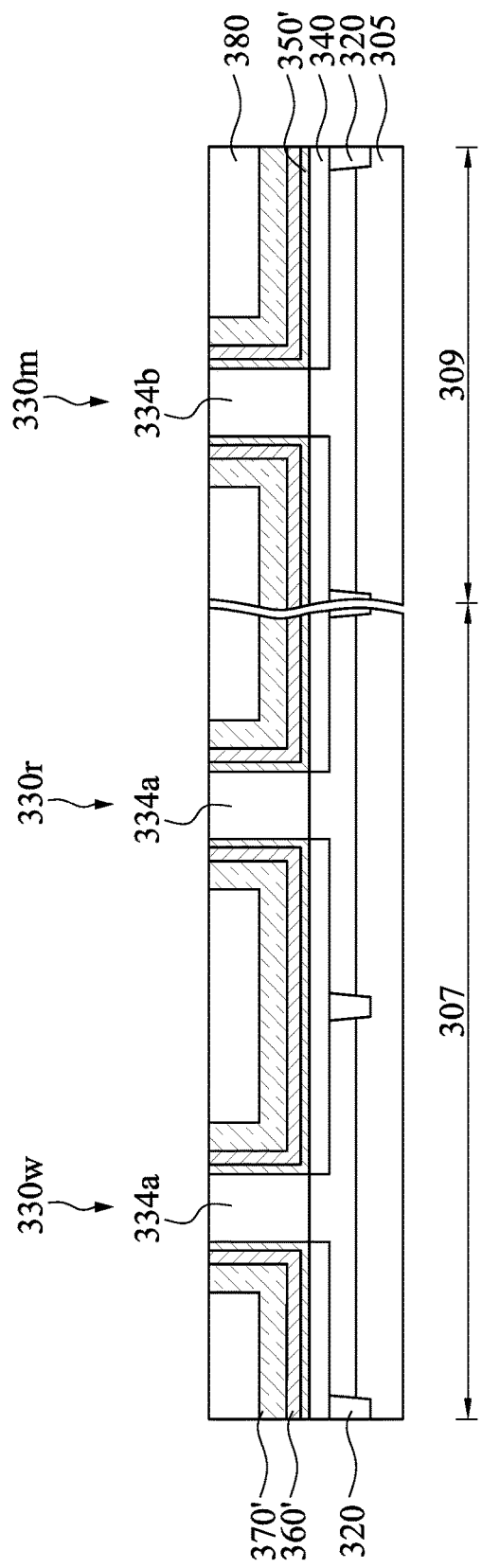

In operation S64 of method M50, a first interlayer dielectric (ILD) 380 is formed over the conductive film 370', as shown in FIG. 11G. The first ILD 380 may include a low-k dielectric having a k-value less than about 3.9, such as about 2.8 or even less. In some embodiments, the first ILD 380 includes a flowable oxide formed using, for example, flowable chemical vapor deposition (FCVD). In some embodiments, the first ILD 380 may also include a protection layer (not separately illustrated) beneath the flowable oxide, the materials of such protection layer include SiN, SiON, and the like. In some embodiments, the first ILD 380 may be used as a planarization layer to provide a level top surface for subsequent processing. Thus, a CMP (or other suitable planarization process) may be performed to level the top surfaces of the first ILD 380 and the portions 334a and 334b.

Figure 11H:
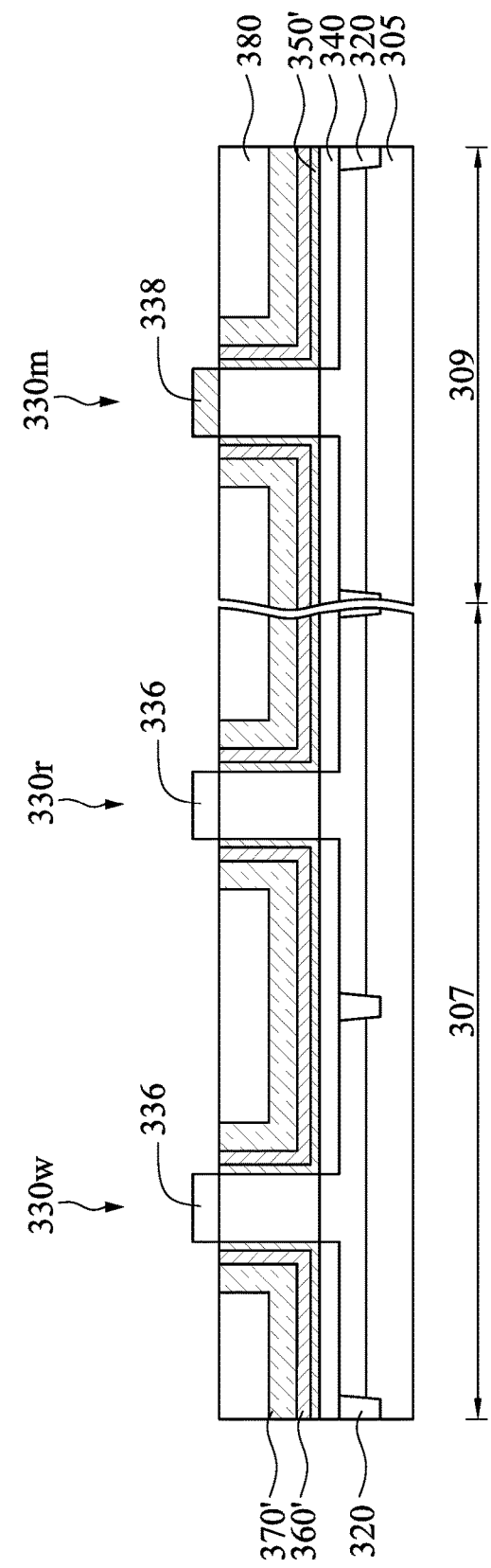

In operation S66 of method M50, top source/drain portions 336 and a top tunneling layer 338 are respectively formed over the nanowires 330w, 330r, and 330m, as shown in FIG. 11H. In some embodiments, an epitaxial layer may be formed over the structure in FIG. 11G, and the epitaxial layer is patterned to form the top source/drain portions 336 respectively over the nanowires 330w and 330r. Then, a dielectric layer is at least formed over the memory region 309, and the dielectric layer is patterned to form a top tunneling layer 338 over the nanowire 330m. In some embodiments, the top source/drain portions 336 may be highly-doped (e.g., having a dopant concentration of about $1\times10^{20}$ $cm^{-3}$ to about $1\times10^{22}$ $cm^{-3}$ or even greater). The top tunneling layer 338 may have the same or similar materials to the second interfacial layer 135 shown in FIG. 2C.

Figure 11I:
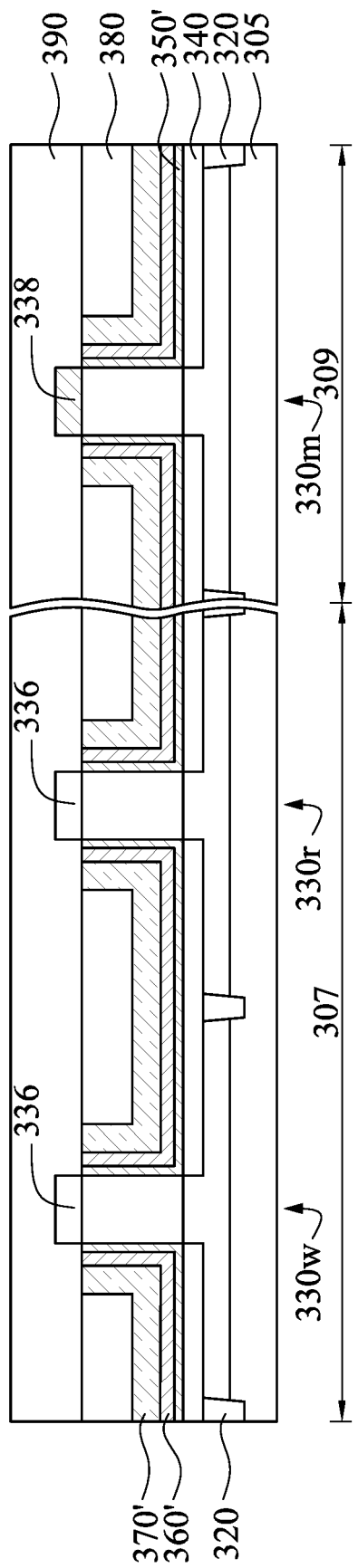

In operation S68 of method M50, a second spacer 390 is formed around the top source/drain portion 336 and the top tunneling layer 338, as shown in FIG. 11I. In some embodiments, the second spacer 390 may include a similar material as the first spacer 340 (e.g., silicon nitride). The second spacer 390 may be formed as a blanket layer. The second spacer 390 may cover top surfaces of the top source/drain portion 336 and the top tunneling layer 338.

Figure 11J:
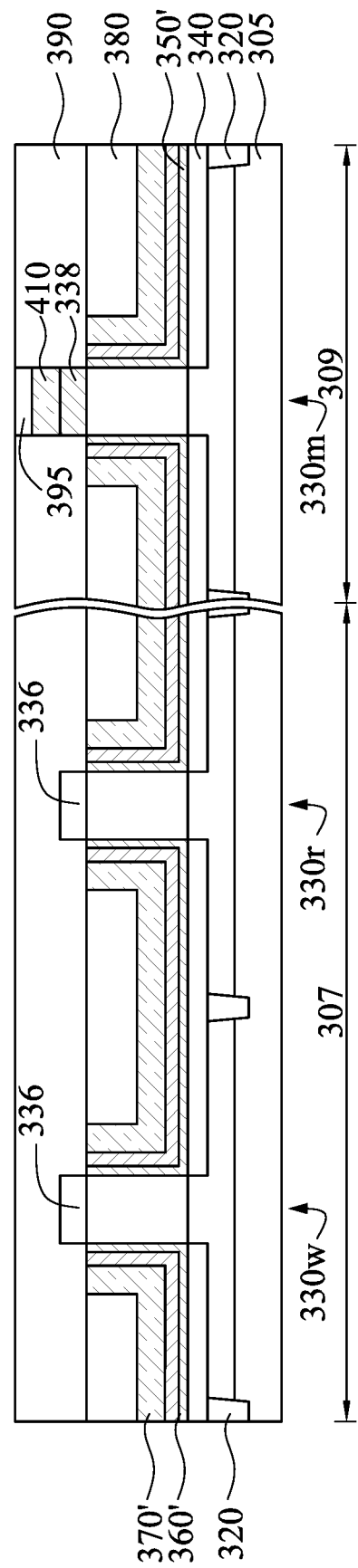

In operation S70 of method M50, a second electrode 410 is formed over the top tunneling layer 338, as shown in FIG. 11J. For example, an opening is formed in the second spacer 390 to expose the top tunneling layer 338, and conductive material is filled in the opening. In some embodiments, the conductive material may be etched back to form the second electrode 410, and another spacer 395 is filled in the remaining opening to cover the second electrode 410. In some embodiments, the second electrodes 410 and 155b (see FIG. 2G) have the same or similar materials.

Figure 11K:
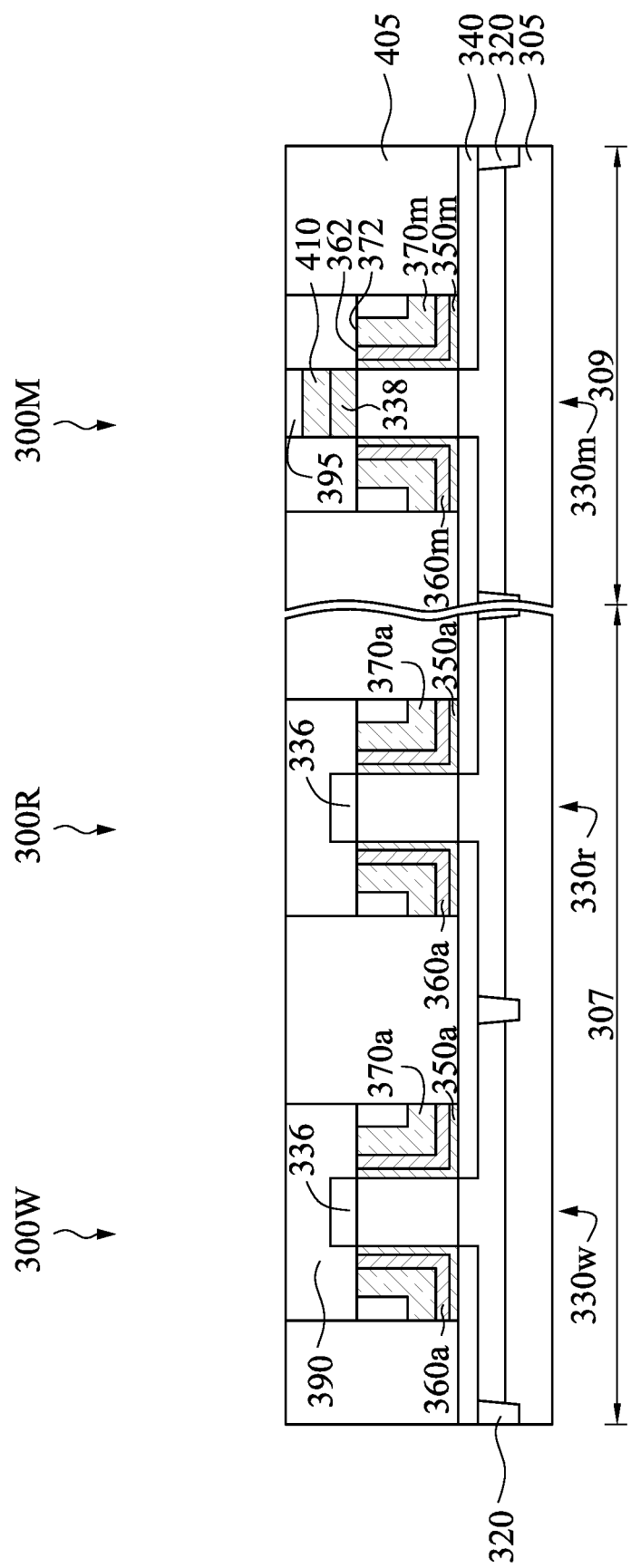

In operation S72 of method M50, the dielectric film 360' and the conductive film 370' are patterned to form a memory cell 300M, a writing transistor 300W, and a reading transistor 300R, as shown in FIG. 11K. In some embodiments, another mask (not shown) is formed over the structure of FIG. 11J, and a patterning process is performed to pattern the dielectric film 360' and the conductive film 370'. In FIG. 11K, the nanowire 330m, the first electrode 370m, the second electrode 410, the storage layer 360m, and the sidewall tunneling layer 350 are referred to as the memory cell 300M. The nanowire 330w, the gate electrode 370a, the gate dielectric layer 360a, and the interfacial layer 350a are referred to as the writing transistor 300W. The nanowire 330r, the gate electrode 370a, the gate dielectric layer 360a, and the interfacial layer 350a are referred to as the reading transistor 300R. Then, a second ILD 405 is formed to surround the memory cell 300M, the writing transistor 300W, and the reading transistor 300R. In some embodiments, the ILDs 405 and 380 may have the same or similar material.

In FIG. 11K, the thickness of the sidewall tunneling layer 350 is less than the thickness of the storage layer 360m. The storage layer 360m wraps around the sidewall tunneling layer 350, and the first electrode 370m wraps around the storage layer 360m. Since the storage layer 360m and the first electrode 370m are etched back together, the sidewalls 362 and 372 of the storage layer 360m and the first electrode 370m may substantially aligned. The second electrode 410 is on and in contact with the top tunneling layer 338 and spaced apart from the storage layer 360m. Further, the storage layer 360m may be spaced apart from the top tunneling layer 338.

Figure 11L:
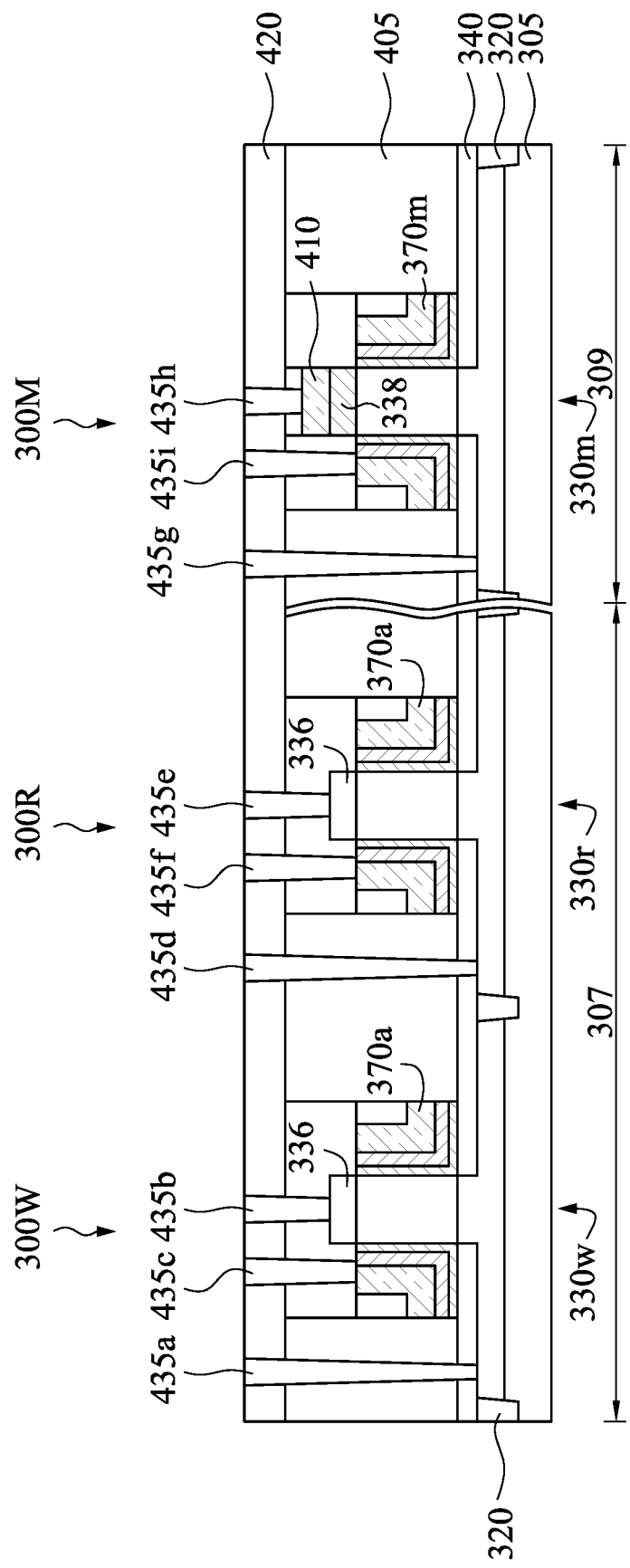
Figure 11M:
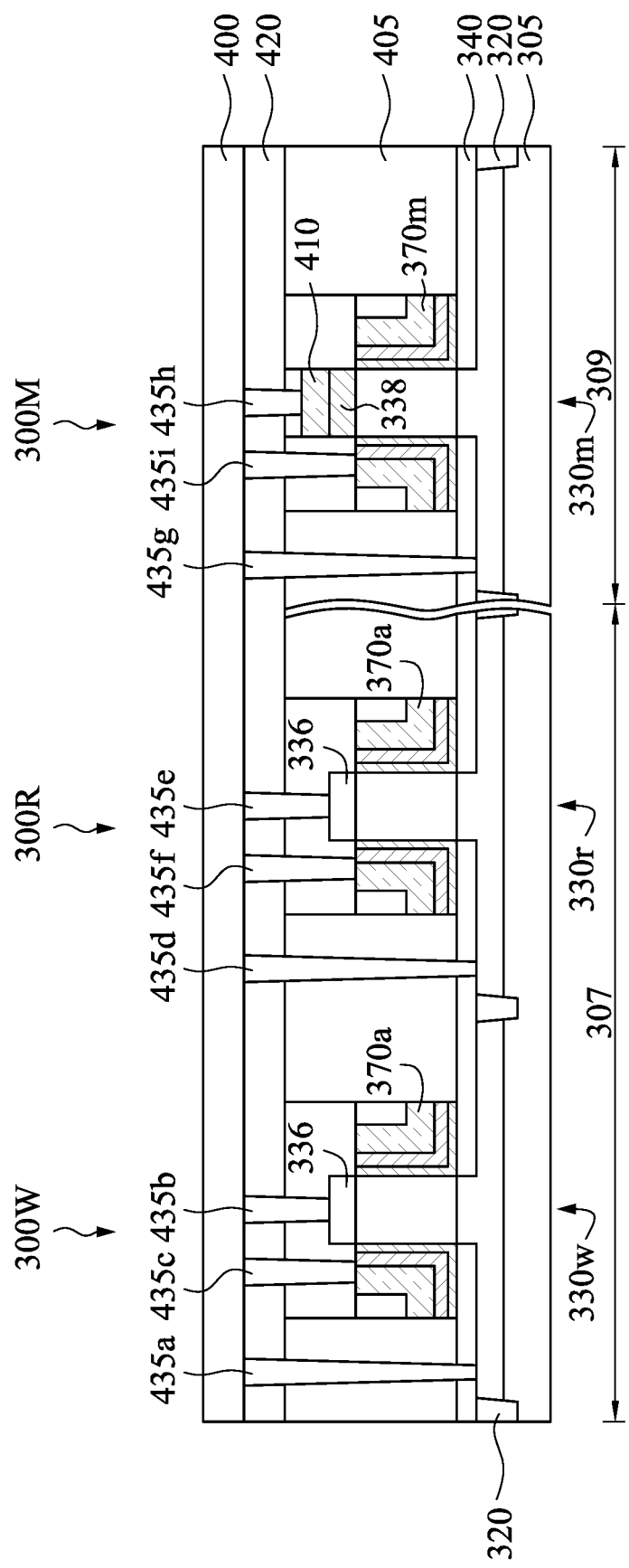

In operation S74 of method M50, a plurality of contacts and an IMD layer 400 is formed over the first ILD 380 to interconnect the memory cell 300M, the writing transistor 300W, and the reading transistor 300R, as shown in FIGS. 11L and 11M. Reference is made to FIG. 11L. A third ILD 420 is formed over the base substrate 305. In some embodiments, the ILDs 420 and 380 may have the same or similar material. Then, a plurality of contacts 435a-435i are formed in the second ILD 420. The contacts 435a-435i may be made of tungsten, aluminum, copper, or other suitable materials. The contact 435a is in contact with one of the bottom source/drain portion 332a (See FIG. 11C) of the writing transistor 300W, the contact 435b is in contact with the top source/drain portion 336 (See FIG. 11C) of the writing transistor 300W, the contact 435c is in contact with the gate electrode 370a of the writing transistor 300W, the contact 435d is in contact with the bottom source/drain portion 332a (See FIG. 11C) of the reading transistor 300R, the contact 435e is in contact with the top source/drain portion 336 (See FIG. 11C) of the reading transistor 300R, the contact 435f is in contact with the gate electrode 370a of the reading transistor 300R, the contact 435g is in contact with the third electrode 332b (see FIG. 11C) of the memory cell 300M, the contact 435h is in contact with the second electrode 410 of the memory cell 300M, and the contact 435i is in contact with the first electrode 370m of the memory cell 300M.

Reference is made to FIG. 11M. Then, the IMD layer 400 is formed over the ILDs 420 and 380 and the contacts 435a-435i to interconnect the writing transistor 300W, the reading transistor 300R, and the memory cell 300M. Since the structure and formations of the IMD layer 400 is similar to the IMD layer 180 in FIG. 2G, a detailed description is not repeated hereinafter.

Figure 12:
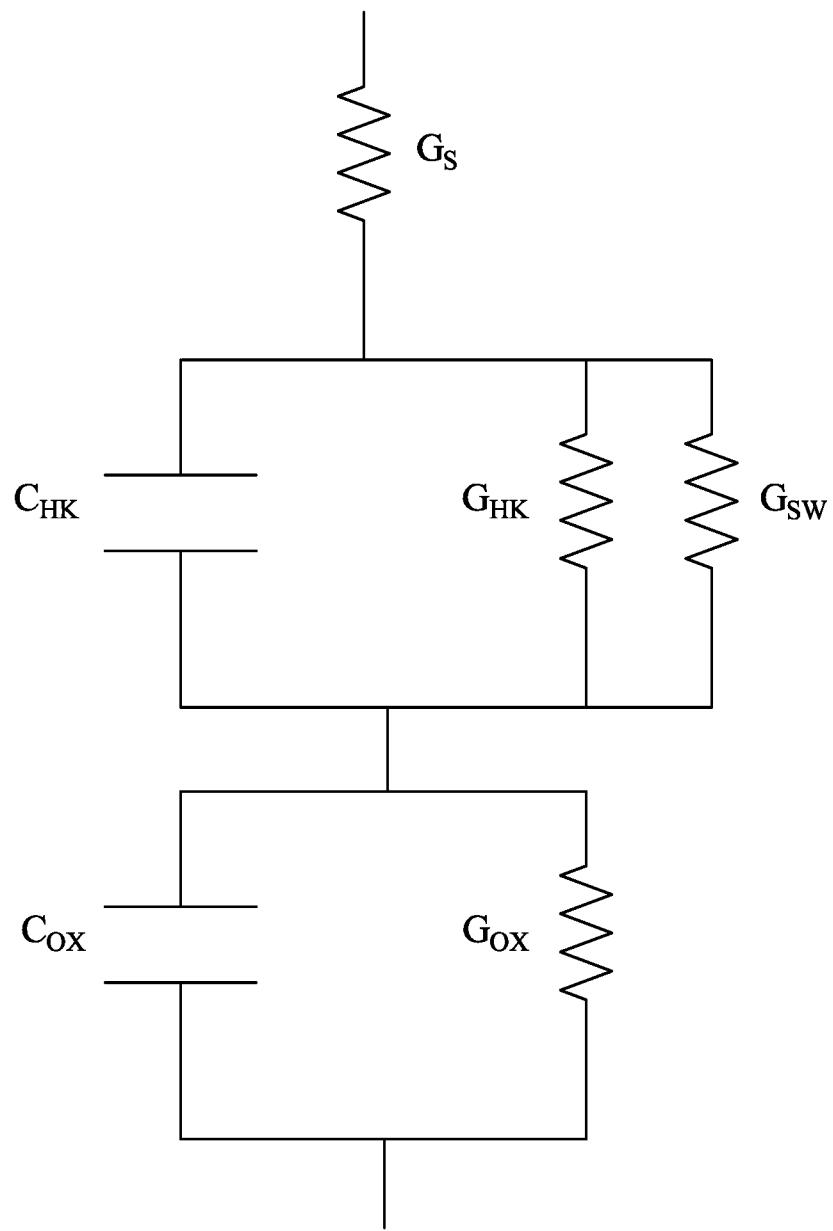
FIG. 12 is an equivalent circuit model of the memory cell 100M or 300M according to some embodiments of the present disclosure.

FIG. 12 is an equivalent circuit model of the memory cell 100M or 300M according to some embodiments of the present disclosure. In FIG. 12, the memory cell has an effective conductance $G_S$ of the semiconductor substrate (and the contacts), an effective conductance $G_{HK}$ of the storage layer, an effective conductance $G_{sw}$ of the sidewall of the storage layer, an effective conductance $G_{OX}$ of the tunneling layer, a capacitance $C_{HK}$ of the storage layer, and a capacitance $C_{OX}$ of the tunneling layer. The conductance $G_{HK}$ and $G_{OX}$ represent the leakage paths which are intrinsic in the corresponding layer/material. The conductance $G_S$ represents the series conductance originated from the substrate (and contacts). The conductance $G_{sw}$ is used to simulate the leakage path due to the additional traps at the sidewall of the storage layer. The simulation results show that the memory device with sidewall etched process possesses lower capacitance compared to a sample without the sidewall etched process at the same frequency. Moreover, the simulation results are fit with the experiment results.

Based on the above discussions, it can be seen that the present disclosure offers advantages. It is understood, however, that other embodiments may offer additional advantages, and not all advantages are necessarily disclosed herein, and that no particular advantages are required for all embodiments. One advantage is that the sidewall etched process of the storage layer provide large current window which increases distinct states of the memory cells. Another advantage is that the storage layer with a sidewall near the second electrode provides good retention. Yet another advantage is that the improved memory cells do not add area burden to the memory device.

According to some embodiments, a memory device includes a memory cell, a writing transistor, and a reading transistor. The memory cell includes a semiconductor substrate, a tunneling layer, a storage layer, a first electrode, a second electrode, and a third electrode. The tunneling layer is over the semiconductor substrate. The storage layer is on the tunneling layer. The first electrode is on the storage layer. The second electrode is on the tunneling layer. The storage layer has a sidewall facing the second electrode. The third electrode is spaced apart from the second electrode. The writing transistor is electrically connected to the first electrode of the memory cell. The reading transistor is electrically connected to the second electrode of the memory cell.

According to some embodiments, a memory device includes a memory cell, a writing transistor, and a reading transistor. The memory cell includes a nanowire, a top tunneling layer, a sidewall tunneling layer, a storage layer, a first electrode, and a second electrode. The nanowire protrudes from a substrate. The top tunneling layer above the nanowire. The sidewall tunneling layer is on a sidewall of the nanowire. The storage layer wraps around the sidewall tunneling layer. The first electrode wraps around the sidewall tunneling layer. The second electrode is on the nanowire and spaced apart from the storage layer. The writing transistor is electrically connected to the first electrode of the memory cell. The reading transistor is electrically connected to the second electrode of the memory cell.

According to some embodiments, a method for manufacturing a memory device includes forming a writing transistor and a reading transistor over a substrate. A memory cell is formed over the substrate. An inter-metal dielectric layer is formed over the writing transistor, the reading transistor, and the memory cell to interconnect the writing transistor, the reading transistor, and the memory cell. The process of forming the memory cell includes forming a tunneling layer over the substrate. A blanket dielectric layer is formed over the tunneling layer and the substrate. The blanket dielectric layer is etched to form a storage layer on the tunneling layer. The first electrode is formed over the tunneling layer. The second electrode is formed on the tunneling layer and adjacent the storage layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a memory device, comprising:
    forming a writing transistor and a reading transistor over a substrate;
    forming a memory cell over the substrate, comprising:
        forming a tunneling layer over the substrate;
        forming a blanket dielectric layer over the tunneling layer and the substrate;
        etching the blanket dielectric layer to form a storage layer on the tunneling layer;
        forming a first electrode over the tunneling layer; and
        forming a second electrode on the tunneling layer and adjacent the storage layer; and
    forming an inter-metal dielectric layer over the writing transistor, the reading transistor, and the memory cell to interconnect the writing transistor, the reading transistor, and the memory cell.

2. The method of claim 1, wherein forming the memory cell further comprises:
    forming a third electrode on a bottom surface of the substrate.

3. The method of claim 1, wherein forming the memory cell further comprises:
    forming an implantation region in the substrate, under the tunneling layer, and spaced apart from the tunneling layer.

4. The method of claim 1, wherein the storage layer has a dielectric constant higher than that of the tunneling layer.

5. The method of claim 1, wherein the etching is dry etching.

6. The method of claim 1, wherein the etching is wet etching.

7. A method comprising:
forming source/drain regions in a transistor region of a substrate;
forming a first interfacial layer over the transistor region and between the source/drain regions and a second interfacial layer over a memory region of the substrate after forming the source/drain regions;
forming a gate dielectric layer over the first interfacial layer and a storage layer over the second interfacial layer such that the storage layer exposes a portion of the second interfacial layer;
forming a gate electrode over the gate dielectric layer, a first electrode over the storage layer, and a second electrode over the portion of the second interfacial layer such that the storage layer laterally surrounds the second electrode; and
forming an inter-metal dielectric layer over the substrate to interconnect the source/drain regions, the gate electrode, the first electrode, and the second electrode.

8. The method of claim 7, wherein forming the gate dielectric layer and the storage layer comprises:
forming an amorphous high-k material over the first interfacial layer and the second interfacial layer; and
wet etching the amorphous high-k material to form the gate dielectric layer and the storage layer.

9. The method of claim 7, wherein forming the gate dielectric layer and the storage layer comprises:
forming an amorphous high-k material over the first interfacial layer and the second interfacial layer; and
dry etching the amorphous high-k material to form the gate dielectric layer and the storage layer.

10. The method of claim 7, wherein forming the gate dielectric layer and the storage layer comprises:
forming a polycrystalline high-k material over the first interfacial layer and the second interfacial layer; and
wet etching the polycrystalline high-k material to form the gate dielectric layer and the storage layer.

11. The method of claim 7, wherein the gate dielectric layer and the storage layer are made of same materials.

12. The method of claim 7, wherein the gate electrode is formed after forming the source/drain regions.

13. The method of claim 7, further comprising forming a third electrode on a backside of the substrate such that the storage layer is direct between the first electrode and the third electrode.

14. A method comprising:
forming an isolation structure in a substrate to define a transistor region and a memory region in the substrate;
forming source/drain regions in the transistor region of the substrate;
forming an interfacial layer over the transistor region of the substrate and between the source/drain regions;
forming a tunneling layer over the memory region of the substrate;
subsequently forming a blanket dielectric layer and a blanket conductive layer over the interfacial layer and the tunneling layer;
patterning the blanket conductive layer to form a gate electrode over the interfacial layer and a first electrode over the tunneling layer;
after patterning the blanket conductive layer, patterning the blanket dielectric layer to form a gate dielectric layer between the gate electrode and the interfacial layer and a storage layer between the first electrode and the tunneling layer;
after patterning the blanket dielectric layer, forming a second electrode over the tunneling layer and surrounded by the first electrode; and
forming an inter-metal dielectric layer over the substrate to interconnect the source/drain regions, the gate electrode, the first electrode, and the second electrode.

15. The method of claim 14, wherein patterning the blanket dielectric layer is such that the storage layer exposes a portion of a bottom surface of the first electrode.

16. The method of claim 14, wherein patterning the blanket dielectric layer is such that a sidewall of the storage layer has facets.

17. The method of claim 16, wherein forming the second electrode is such that the facets of the storage layer face the second electrode.

18. The method of claim 14, further comprising forming a third electrode under the memory region of the substrate.

19. The method of claim 14, wherein the tunneling layer and the interfacial layer are made of same materials.

20. The method of claim 14, wherein the storage layer is a high-K dielectric layer.

* * * * *